US011012050B2

United States Patent
Nosaka

(10) Patent No.: US 11,012,050 B2
(45) Date of Patent: May 18, 2021

(54) RADIO-FREQUENCY FILTER, RADIO-FREQUENCY FRONT-END CIRCUIT, AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/515,454

(22) Filed: Jul. 18, 2019

(65) Prior Publication Data
US 2019/0341909 A1    Nov. 7, 2019

Related U.S. Application Data

(63) Continuation of application No. PCT/JP2018/001252, filed on Jan. 17, 2018.

(30) Foreign Application Priority Data

Jan. 19, 2017  (JP) .............................. JP2017-007595

(51) Int. Cl.
*H03H 9/52* (2006.01)
*H01Q 1/50* (2006.01)
(Continued)

(52) U.S. Cl.
CPC ................ *H03H 9/52* (2013.01); *H01Q 1/50* (2013.01); *H03H 9/13* (2013.01); *H03H 9/17* (2013.01);
(Continued)

(58) Field of Classification Search
CPC .. H03H 9/52; H03H 9/13; H03H 9/17; H03H 9/542; H03H 9/545; H01Q 1/50; H04B 1/006
(Continued)

(56) References Cited

U.S. PATENT DOCUMENTS 6,023,611 A    2/2000   Bolin et al.
6,472,953 B1   10/2002  Sakuragawa et al.
(Continued)

FOREIGN PATENT DOCUMENTS

JP    2000-323961 A    11/2000
JP    2001-512642 A    8/2001
(Continued)

OTHER PUBLICATIONS

International Search Report for International Application No. PCT/JP2018/001252, dated Mar. 13, 2018.
(Continued)

*Primary Examiner* — Benny T Lee
*Assistant Examiner* — Hafizur Rahman
(74) *Attorney, Agent, or Firm* — Pearne & Gordon LLP

(57) ABSTRACT

A radio-frequency filter (10) includes a series arm resonator (s1) connected between input/output terminals (11m and 11n) and parallel arm circuits (110 and 120) connected to a node (x1) and a ground. The parallel arm circuit (110) includes a parallel arm resonator (p1) and a variable frequency circuit (110A) connected in series with each other between the node (x1) and a ground. The variable frequency circuit (110A) changes the resonant frequency of the parallel arm circuit (110). The variable frequency circuit (110A) is connected in series with the parallel arm resonator (p1) and includes a capacitor (C1) and a switch (SW1) connected in parallel with each other. The parallel arm circuit (120) includes a capacitor (C2) and a switch (SW2) connected in series with each other between the node (x1) and a ground.

15 Claims, 27 Drawing Sheets

(51) Int. Cl.
*H03H 9/13* (2006.01)
*H03H 9/17* (2006.01)
*H03H 9/54* (2006.01)
*H04B 1/00* (2006.01)
*H03H 9/64* (2006.01)

(52) U.S. Cl.
CPC ............ *H03H 9/542* (2013.01); *H03H 9/545* (2013.01); *H03H 9/6403* (2013.01); *H03H 9/6483* (2013.01); *H04B 1/006* (2013.01)

(58) Field of Classification Search
USPC ....................................................... 333/195
See application file for complete search history.

(56) References Cited

U.S. PATENT DOCUMENTS

| | | | |
|---|---|---|---|
| 10,256,791 B2* | 4/2019 | Tsutsumi | ............... H03H 9/171 |
| 2003/0062969 A1 | 4/2003 | Inoue | |
| 2008/0042781 A1 | 2/2008 | Kando | |
| 2009/0251235 A1* | 10/2009 | Belot | ..................... H03H 9/605 |
| | | | 333/187 |
| 2014/0340173 A1* | 11/2014 | Burgener | ............. H03H 9/0009 |
| | | | 333/188 |
| 2016/0294357 A1 | 10/2016 | Tani | |
| 2017/0359051 A1 | 12/2017 | Murata | |

FOREIGN PATENT DOCUMENTS

| | | |
|---|---|---|
| JP | 2003-101373 A | 4/2003 |
| JP | 2011-146768 A | 7/2011 |
| WO | 2006/123518 A1 | 11/2006 |
| WO | 2009/025055 A1 | 2/2009 |
| WO | 2015/087894 A1 | 6/2015 |
| WO | 2016/104598 A1 | 6/2016 |
| WO | 2016/158954 A1 | 10/2016 |

OTHER PUBLICATIONS

Written Opinion for International Application No. PCT/JP2018/001252, dated Mar. 13, 2018.

* cited by examiner

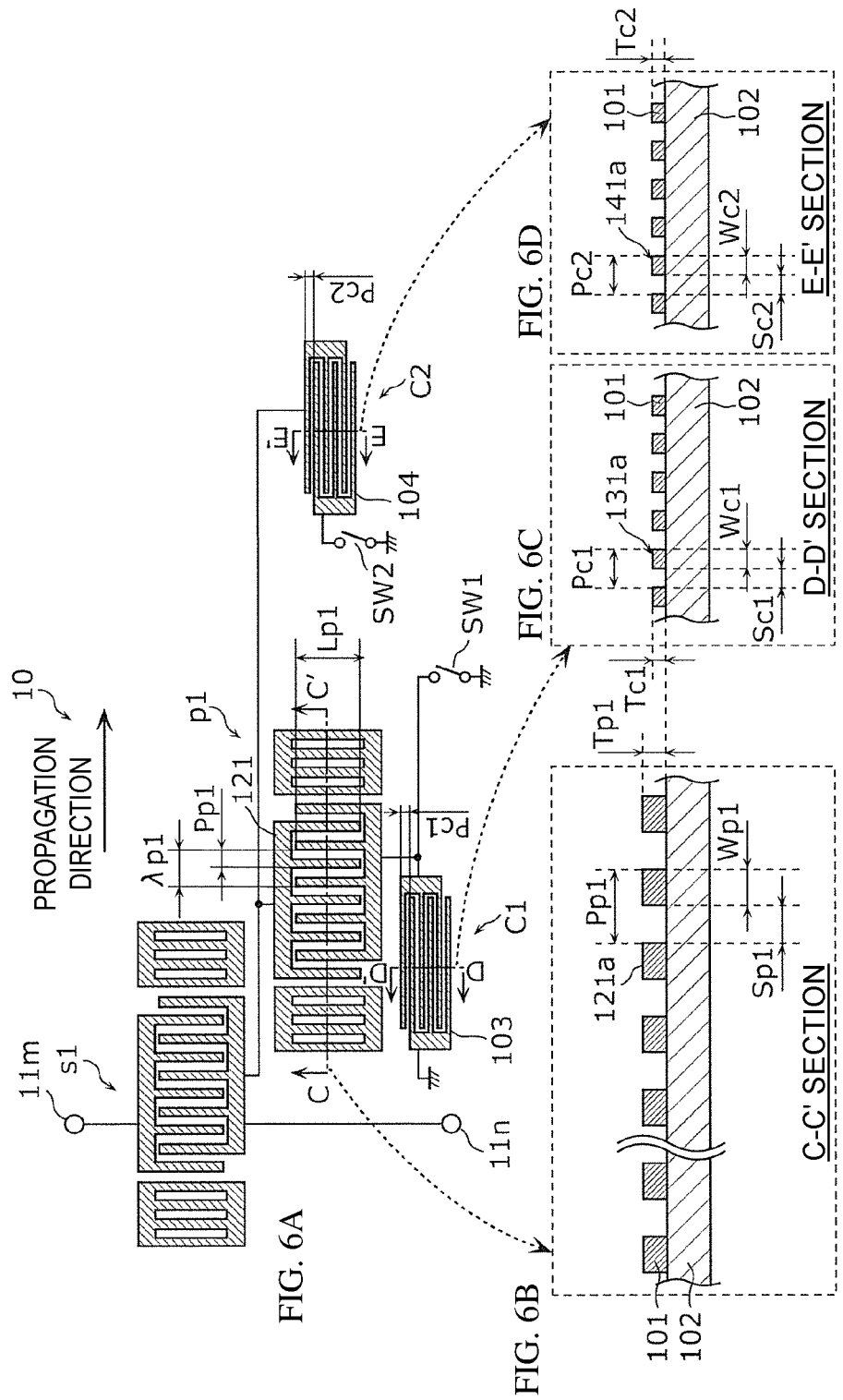

SW1off, SW2off

ELECTRODE FINGER THICKNESS =
0.020 × ELECTRODE FINGER PITCH

ELECTRODE FINGER PITCH OF SERIES
ARM RESONATOR s1 = 2.78 μm

——— ELECTRODE FINGER PITCH OF CAPACITOR C1 = 0.75 μm
− − − ELECTRODE FINGER PITCH OF CAPACITOR C1 = 1.75 μm
− · − ELECTRODE FINGER PITCH OF CAPACITOR C1 = 2.50 μm
· · · · · ELECTRODE FINGER PITCH OF CAPACITOR C1 = 4.00 μm

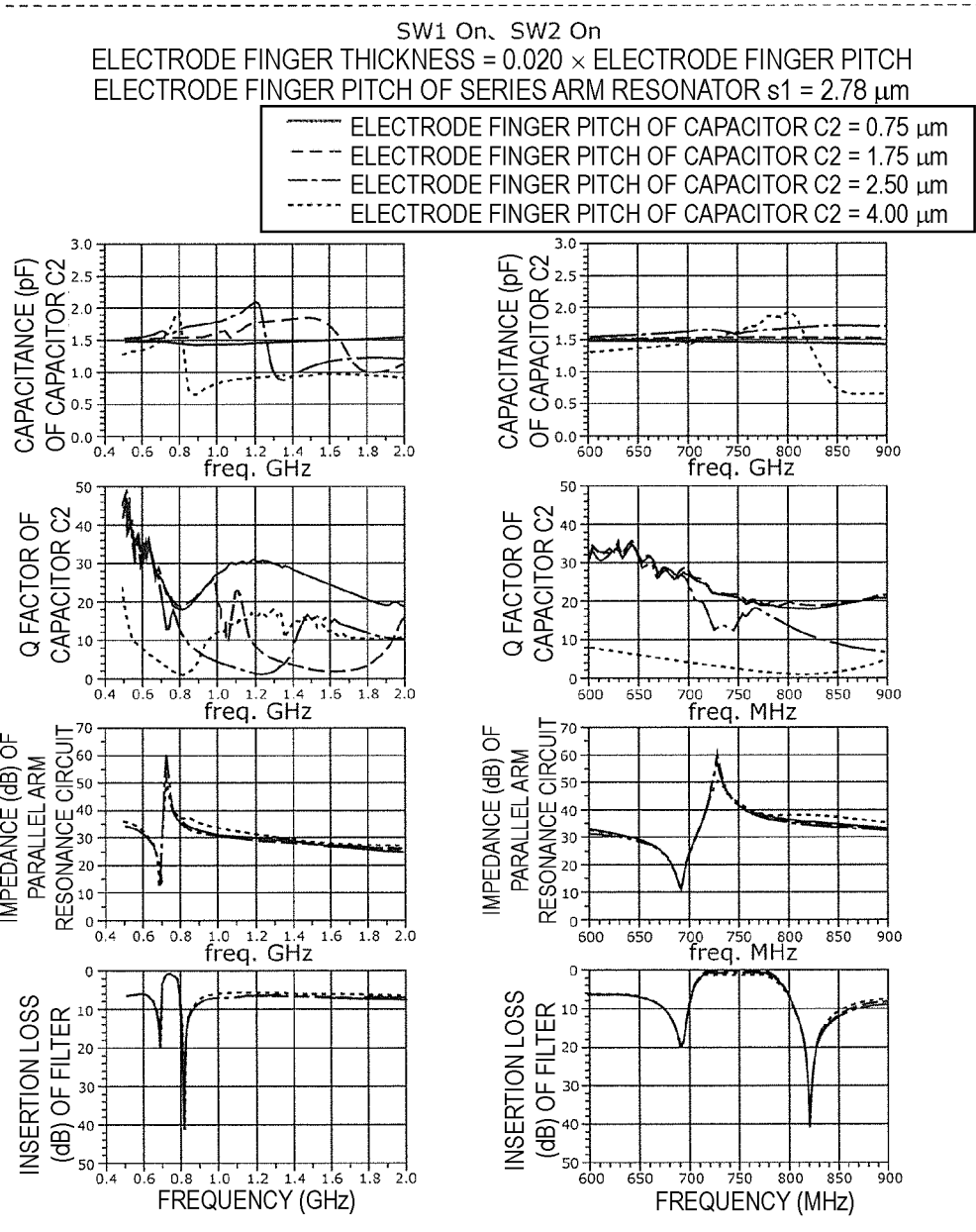

RADIO-FREQUENCY FILTER, RADIO-FREQUENCY FRONT-END CIRCUIT, AND COMMUNICATION APPARATUS

This is a continuation of International Application No. PCT/JP2018/001252 filed on Jan. 17, 2018 which claims priority from Japanese Patent Application No. 2017-007595 filed on Jan. 19, 2017. The contents of these applications are incorporated herein by reference in their entireties.

BACKGROUND OF THE DISCLOSURE

Field of the Disclosure

The present disclosure relates to a radio-frequency filter including a resonator, a radio-frequency front-end circuit, and a communication apparatus.

Description of the Related Art

Hitherto, an acoustic wave filter using acoustic waves is widely used as a band pass filter, such as that disposed in a front-end portion of a mobile communication device. Additionally, to respond to multimode/multiband technologies, a radio-frequency front-end circuit including multiple acoustic wave filters has been put to practical use.

For example, in a multiband-support acoustic wave filter including a ladder-filter parallel arm resonance circuit constituted by BAW (Bulk Acoustic Wave) resonators, the following configuration of the parallel arm resonance circuit (see Patent Document 1, for example) is known. This parallel arm resonance circuit includes a parallel arm resonator and a parallel circuit of a capacitor and a switch connected in series with the parallel arm resonator. Such an acoustic wave filter forms a tunable filter that can change the frequency of the pass band and that of the attenuation band as a result of switching the switch between ON and OFF.

Patent Document 1: U.S. Patent Application Publication No. 2009/0251235

BRIEF SUMMARY OF THE DISCLOSURE

In a typical ladder filter including a series arm resonance circuit and a parallel arm resonance circuit, the pass band is determined by the anti-resonant frequency of the parallel arm resonance circuit and the resonant frequency of the series arm resonance circuit, the attenuation pole on the lower-frequency side of the pass band is determined by the resonant frequency of the parallel arm resonance circuit, and the attenuation pole on the higher-frequency side of the pass band is determined by the anti-resonant frequency of the series arm resonance circuit.

In the above-described configuration of the related art, however, as a result of changing the switch between ON and OFF, only the resonant frequency of the parallel arm resonance circuit changes, but the anti-resonant frequency of the parallel arm resonance circuit remains the same. Accordingly, for shifting the pass band and the attenuation band to the lower-frequency side, if the attenuation pole on the lower-frequency side of the pass band is moved farther to the lower-frequency side as a result of the switch between being changed ON and OFF, only the attenuation pole is moved. This decreases the sharpness of the attenuation slope, which may increase the insertion loss at the low edge of the pass band (the shoulder characteristics at the low edge of the pass band are decreased). Decreasing the shoulder characteristics at an edge of the pass band means that the insertion loss at the frequency at the edge of the pass band is increased. That is, in the above-described configuration, when the pass band is switched to the lower-frequency side, the loss at the low edge of the pass band is increased.

The present disclosure has been made to solve the above-described problem. It is an object of the present disclosure to provide a radio-frequency filter, a radio-frequency front-end circuit, and a communication apparatus that can change each of a pass band and an attenuation band substantially without increasing the insertion loss at a low edge of the pass band.

To achieve the above-described object, a radio-frequency filter according to an aspect of the present disclosure includes a series arm circuit and first and second parallel arm circuits. The series arm circuit is connected between first and second input/output terminals. The first parallel arm circuit is connected between a ground and a node on a path connecting the first and second input/output terminals. The second parallel arm circuit is connected to the node and a ground. The first parallel arm circuit includes a parallel arm resonator and a variable frequency circuit between the node and the ground. The variable frequency circuit changes a resonant frequency of the first parallel arm circuit. The variable frequency circuit is connected in series with the parallel arm resonator and includes a first impedance element and a first switch connected in parallel with each other. The second parallel arm circuit includes a first capacitor and a second switch connected in series with each other between the node and the ground.

With this configuration, the radio-frequency filter forms a tunable filter which is constituted by a series arm circuit and a parallel arm resonance circuit (the combined circuit of the first and second parallel arm circuits) and changes the frequency band as a result of switching the first and second switches between ON and OFF. The resonant frequency of the series arm circuit and the anti-resonant frequency of the parallel arm resonance circuit determine the pass band. The resonant frequency of the parallel arm resonance circuit determines the attenuation pole on the lower-frequency side of the pass band, and the anti-resonant frequency of the series arm circuit determines the attenuation pole on the higher-frequency side of the pass band.

When the first switch is ON, the characteristics of the first parallel arm circuit are not influenced by the first impedance element and remain equal to those of the parallel arm resonator. When the first switch is OFF, the characteristics of the first parallel arm circuit are influenced by the first impedance element and exhibit the combined characteristics of the parallel arm resonator and the first impedance element. The resonant frequency of the first parallel arm circuit is shifted. Hence, the frequency of the attenuation pole on the lower-frequency side of the pass band is changed.

When the second switch is ON, the first capacitor functions, and the anti-resonant frequency of the parallel arm resonance circuit shifts to the lower-frequency side. When the second switch is OFF, the first capacitor does not function, and the parallel arm resonance circuit exhibits the characteristics of only the first parallel arm circuit.

That is, the frequency of the attenuation pole determined by the resonant frequency of the parallel arm resonance circuit can be changed by using the first switch, and also, the frequency of the pass band determined by the anti-resonant frequency of the parallel arm resonance circuit can be changed by using the second switch. As a result of the second switch being switched between ON and OFF, the frequency of the pass band becomes variable. When the frequency of the pass band is shifted to the lower-frequency side, it is also possible to change each of the pass band and the attenuation band substantially without increasing the insertion loss at the low edge of the pass band.

The first impedance element may be a second capacitor. When the first switch is ON, the second switch may be ON. When the first switch is OFF, the second switch may be OFF.

With this configuration, when the first switch is OFF, the resonant frequency of the parallel arm resonance circuit shifts to the higher-frequency side. At this time, the second switch is also OFF, thereby making it possible to shift the anti-resonant frequency of the parallel arm resonance circuit to the higher-frequency side. In contrast, when the first switch is ON, the resonant frequency of the parallel arm resonance circuit shifts to the lower-frequency side. At this time, the second switch is also ON, thereby making it possible to shift the anti-resonant frequency of the parallel arm resonance circuit to the lower-frequency side. Hence, when shifting the attenuation band and the pass band to the higher-frequency side or the lower-frequency side at the same time, the pass band can be switched substantially without increasing the insertion loss at the low edge of the pass band.

The parallel arm resonator may include an IDT electrode which is formed on a substrate at least partly exhibiting piezoelectricity and which is constituted by a plurality of electrode fingers. The second capacitor may include the substrate and a second interdigital capacitor electrode which is formed on the substrate and which is constituted by a plurality of electrode fingers. The pitch of the plurality of electrode fingers forming the second interdigital capacitor electrode may be smaller than that of the plurality of electrode fingers forming the parallel arm resonator. The self-resonant frequency of the second capacitor may be located at a higher-frequency side than the pass band of the radio-frequency filter.

As the pitch of the electrode fingers forming the second capacitor is narrower, the self-resonant frequency shifts to the higher-frequency side. The self-resonant frequency is the singularity point at which the Q factor (capacitor Q) of a capacitor element is locally decreased. Because of this reason, the pitch of the electrode fingers of the second interdigital capacitor electrode is set to be narrower than that of the parallel arm resonator so as to shift the self-resonant frequency of the second capacitor to the higher-frequency side than the pass band of the radio-frequency filter. This can increase the Q factor of the second capacitor in the pass band, thereby making it possible to reduce the loss in the pass band.

The film thickness of the plurality of electrode fingers forming the second interdigital capacitor electrode may be smaller than or equal to that of the plurality of electrode fingers forming the parallel arm resonator.

Because of the manufacturing reason, the pitch of the electrode fingers is restricted by the film thickness of the electrode fingers. Accordingly, by setting the film thickness of the electrode fingers of the second capacitor to be smaller than that of the electrode fingers of the parallel arm resonator, the pitch of the electrode fingers of the second capacitor can be decreased to be smaller. This can reduce the size of the second interdigital capacitor electrode and also make it likely to achieve both of the required Q factor of the parallel arm resonator and that of the capacitor element. It is thus possible to decrease the size of the radio-frequency filter and also to reduce the loss in the pass band by achieving both of the required Q factor of the parallel arm resonator and that of the second capacitor.

The parallel arm resonator may include an IDT electrode which is formed on a substrate at least partly exhibiting piezoelectricity and which is constituted by a plurality of electrode fingers. The first capacitor may include the substrate and a first interdigital capacitor electrode which is formed on the substrate and which is constituted by a plurality of electrode fingers. The pitch of the plurality of electrode fingers forming the first interdigital capacitor electrode may be smaller than that of the plurality of electrode fingers forming the parallel arm resonator. The self-resonant frequency of the first capacitor may be located at a higher-frequency side than the pass band of the radio-frequency filter.

As the pitch of the electrode fingers forming the first capacitor is narrower, the self-resonant frequency shifts to the higher-frequency side. The self-resonant frequency is the singularity point at which the Q factor (capacitor Q) of a capacitor element is locally decreased. Because of this reason, the pitch of the electrode fingers of the first interdigital capacitor electrode is set to be narrower than that of the parallel arm resonator so as to shift the self-resonant frequency of the first capacitor to the higher-frequency side than the pass band of the radio-frequency filter. This can increase the Q factor of the first capacitor in the pass band, thereby making it possible to reduce the loss in the pass band.

The film thickness of the plurality of electrode fingers forming the first interdigital capacitor electrode may be smaller than or equal to that of the plurality of electrode fingers forming the parallel arm resonator.

Because of the manufacturing reason, the pitch of the electrode fingers is restricted by the film thickness of the electrode fingers. Accordingly, by setting the film thickness of the electrode fingers of the first capacitor to be smaller than that of the electrode fingers of the parallel arm resonator, the pitch of the electrode fingers of the first capacitor can be decreased to be smaller. This can reduce the size of the first interdigital capacitor electrode and also make it likely to achieve both of the required Q factor of the parallel arm resonator and that of the capacitor element. It is thus possible to decrease the size of the radio-frequency filter and also to reduce the loss in the pass band by achieving both of the required Q factor of the parallel arm resonator and that of the first capacitor.

The first impedance element may be an inductor. When the first switch is ON, the second switch may be OFF. When the first switch is OFF, the second switch may be ON.

With this configuration, when the first switch is OFF, the resonant frequency of the parallel arm resonance circuit shifts to the lower-frequency side. At this time, the second switch is ON, thereby making it possible to shift the anti-resonant frequency of the parallel arm resonance circuit to the lower-frequency side. In contrast, when the first switch is ON, the resonant frequency of the parallel arm resonance circuit shifts to the higher-frequency side. At this time, the second switch is OFF, thereby making it possible to shift the anti-resonant frequency of the parallel arm resonance circuit to the higher-frequency side. Hence, when shifting the attenuation band and the pass band to the lower-frequency side at the same time, the pass band can be switched substantially without increasing the insertion loss at the low edge of the pass band.

The first and second switches may form one switch circuit including first and second selection terminals and one common terminal. The switch circuit may mutually exclusively select a state in which the first selection terminal and the common terminal are electrically connected to each other or a state in which the second selection terminal and the common terminal are electrically connected to each other. One end of each of the first and second switches may be the common terminal. The other end of the first switch may be the first selection terminal. The other end of the second switch may be the second selection terminal.

This configuration can reduce the number of the terminals of the first and second switches and form the first and second switches into one switch circuit, thereby reducing the size of the radio-frequency filter.

The variable frequency circuit may further include a second impedance element connected in series with the first switch. A series circuit of the first switch and the second impedance element may be connected in parallel with the first impedance element. The first impedance element may be one of a capacitor and an inductor, and the second impedance element may be the other one of a capacitor and an inductor.

With this configuration, in the variable frequency circuit, in accordance with the ON/OFF state of the first switch, it is possible to switch between the state in which both of the first and second impedance elements are connected to the parallel arm resonator and the state in which only the first impedance element is connected to the parallel arm resonator, thereby making it possible to considerably change the impedance added to the parallel arm resonator. This significantly changes the resonant frequency of the parallel arm resonance circuit, thereby making it possible to increase the variable frequency range of the attenuation pole on the lower-frequency side of the pass band and that of the low edge of the pass band.

The ON-resistance of the second switch may be higher than that of the first switch.

As the ON-resistance of the first switch and that of the second switch become higher, the insertion loss in the pass band is increased. The degree by which the insertion loss at the low edge of the pass band rises in response to an increase in the ON-resistance of the first switch is higher than that in response to an increase in the ON-resistance of the second switch. A large space is required for forming the switches to contain the ON-resistance of the switches to be small. With the above-described configuration, as a result of reducing the ON-resistance of the first switch, which significantly influences the insertion loss at the low edge of the pass band, to be relatively small in comparison with the ON-resistance of the second switch, the size of the radio-frequency filter can be reduced while maintaining a small loss at the low edge of the pass band.

A plurality of the second parallel arm circuits may be connected in parallel with each other between the node and a ground.

With this configuration, as a result of individually switching the second switches of the plurality of second parallel arm circuits between ON and OFF, the resonant frequency of the parallel arm resonance circuit can be adjusted more precisely. It is thus possible to optimize the insertion loss in the pass band according to the band to be used.

The parallel arm resonator may be one of a surface acoustic wave filter and an acoustic wave filter using BAW (Bulk Acoustic Wave).

With this configuration, the size of the parallel arm resonator can be decreased, thereby reducing the size and the cost of the radio-frequency filter. The surface acoustic wave filter and the acoustic wave filter using BAW typically exhibit high Q-factor characteristics, thereby achieving small-loss, high-selectivity characteristics of the radio-frequency filter.

The first and second switches may be FET switches made of GaAs or CMOS or diode switches.

This makes it possible to constitute each of the first and second switches by one FET switch or one diode switch, thereby reducing the size of the radio-frequency filter.

A radio-frequency front-end circuit according to an aspect of the present disclosure includes the above-described radio-frequency filter and a controller that controls an ON state and an OFF state of each of the first and second switches.

It is thus possible to provide a small-size radio-frequency front-end circuit that can switch the pass band and the attenuation band in accordance with the required frequency specifications substantially without increasing the insertion loss at the low edge of the pass band.

A communication apparatus according to an aspect of the present disclosure includes an RF signal processing circuit and the above-described radio-frequency front-end circuit. The RF signal processing circuit processes a radio-frequency signal to be transmitted by an antenna element and a radio-frequency signal received by the antenna element. The radio-frequency front-end circuit transfers the radio-frequency signals between the antenna element and the RF signal processing circuit.

It is thus possible to provide a small-size communication apparatus that can switch the pass band in accordance with the required frequency specifications substantially without increasing the insertion loss at the low edge of the pass band.

In the radio-frequency filter, the radio-frequency front-end circuit, and the communication apparatus according to the present disclosure, it is possible to change each of a pass band and an attenuation band substantially without increasing the insertion loss at a low edge of the pass band.

Each of FIGS. 6A, 6B, 6C and 6D schematically illustrates the electrode structure of the radio-frequency filter according to the first embodiment.

FIGS. 7A, 7B, 7C and 7D show graphs illustrating the relationships of the electrode finger pitch of an interdigital capacitor C1 to the capacitance and capacitor Q factor of the interdigital capacitor C1, the impedance of a parallel arm circuit, and filter characteristics in a typical example.

Figures 7A, 7B, 7C, 7D:
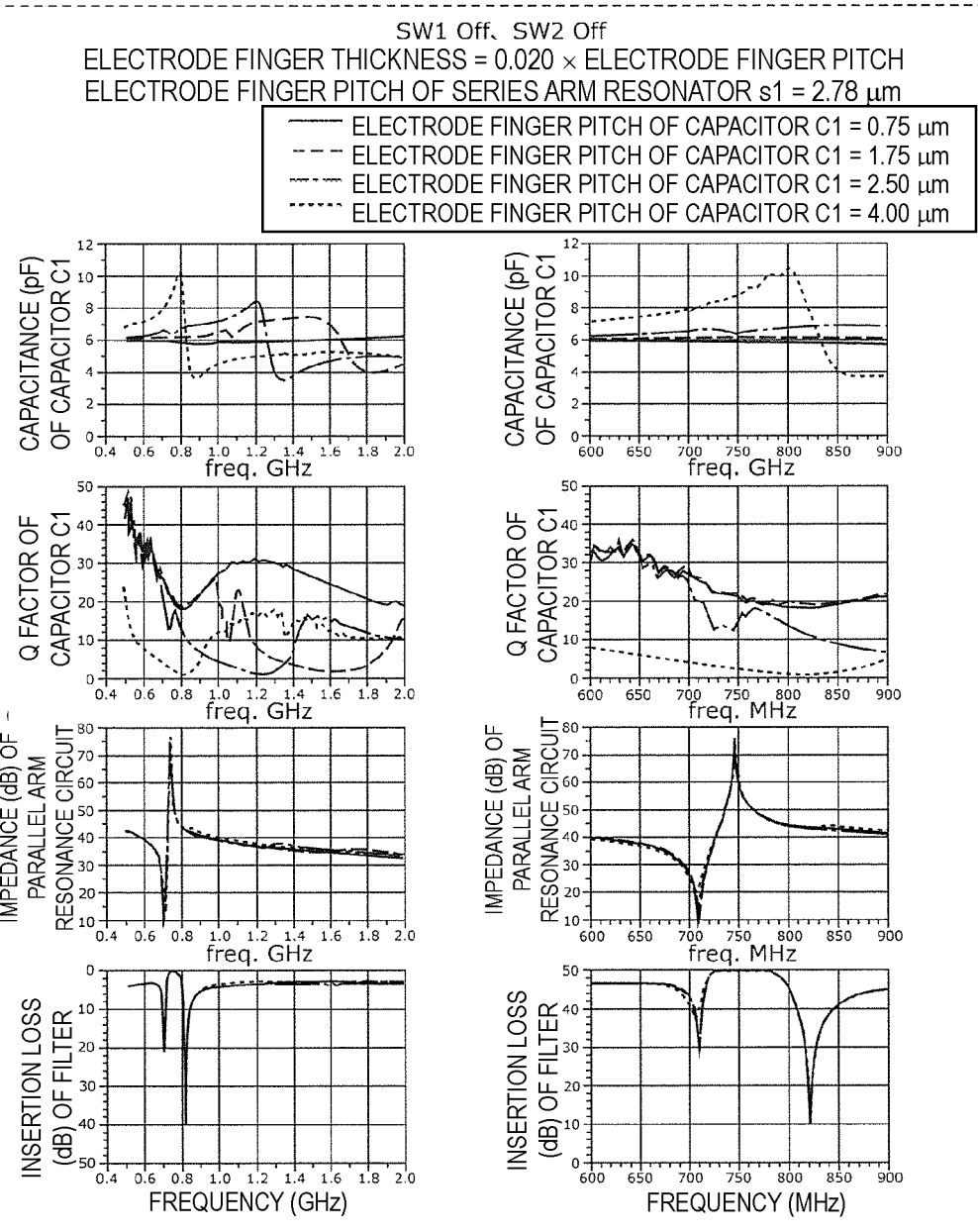
Figure 7E:
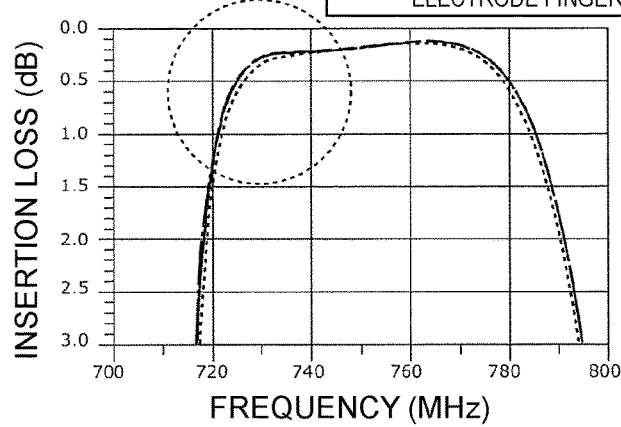

FIG. 7E is a graph illustrating the relationship between the electrode finger pitch of the interdigital capacitor C1 and the insertion loss in the pass band in a typical example.

FIGS. 8A, 8B, 8C and 8D show graphs illustrating the relationships of the electrode finger pitch of an interdigital capacitor C2 to the capacitance and capacitor Q factor of the interdigital capacitor C2, the impedance of a parallel arm circuit, and filter characteristics in a typical example.

Figure 8E:
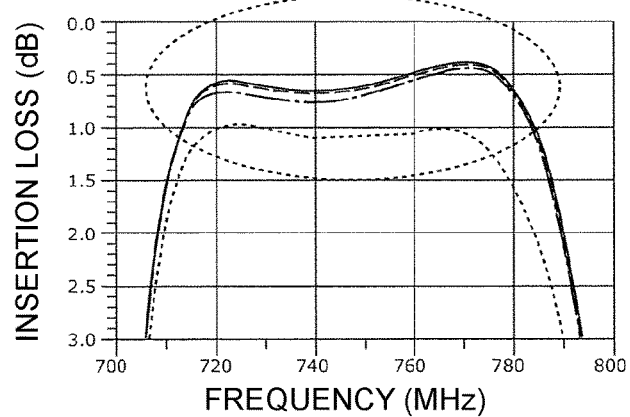

FIG. 8E is a graph illustrating the relationship between the electrode finger pitch of the interdigital capacitor C2 and the insertion loss in the pass band in a typical example.

Figure 9A:
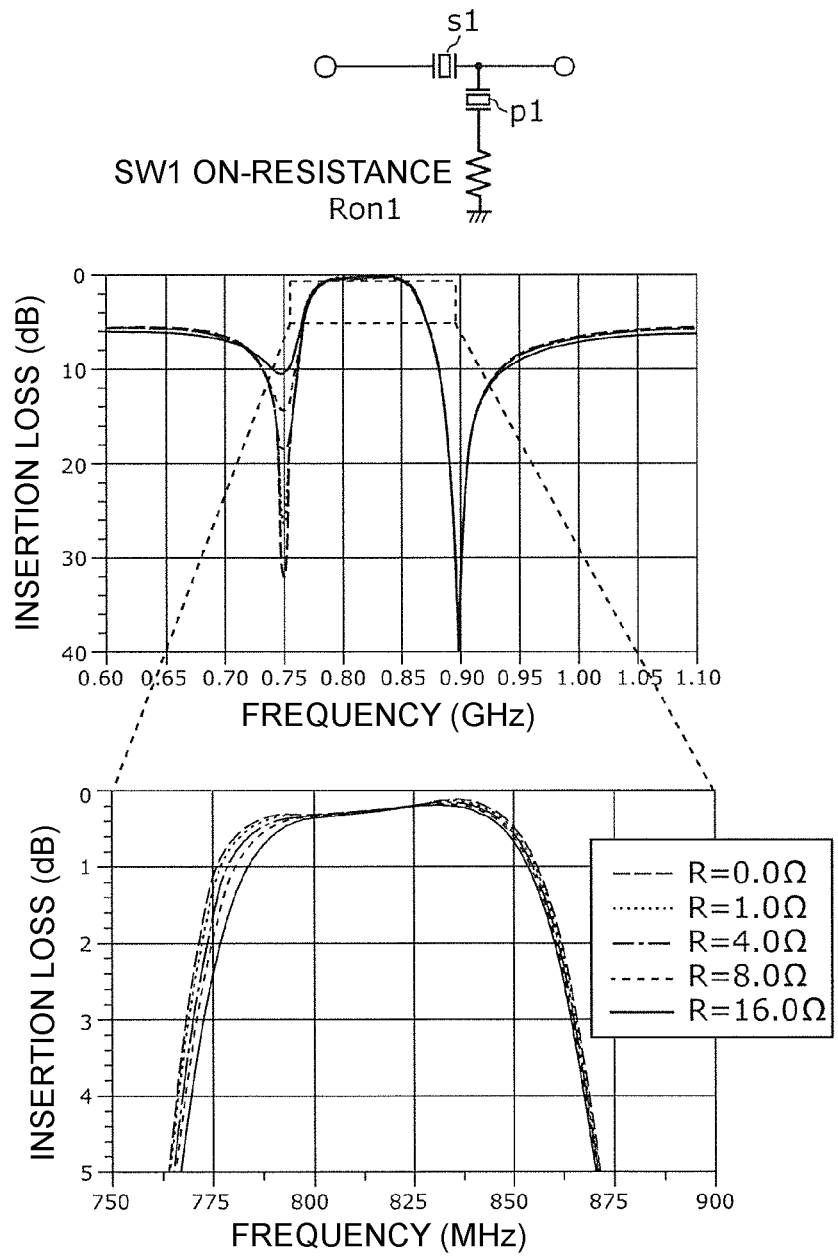

FIG. 9A shows graphs illustrating the relationship between the ON-resistance of a switch SW1 and the filter characteristics in a typical example.

Figure 9B:
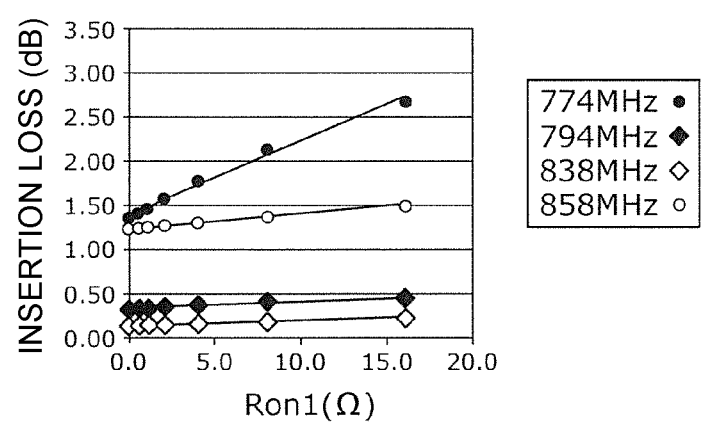

FIG. 9B is a graph illustrating the relationship between the ON-resistance of the switch SW1 and the insertion loss in the pass band in a typical example.

Figure 10A:
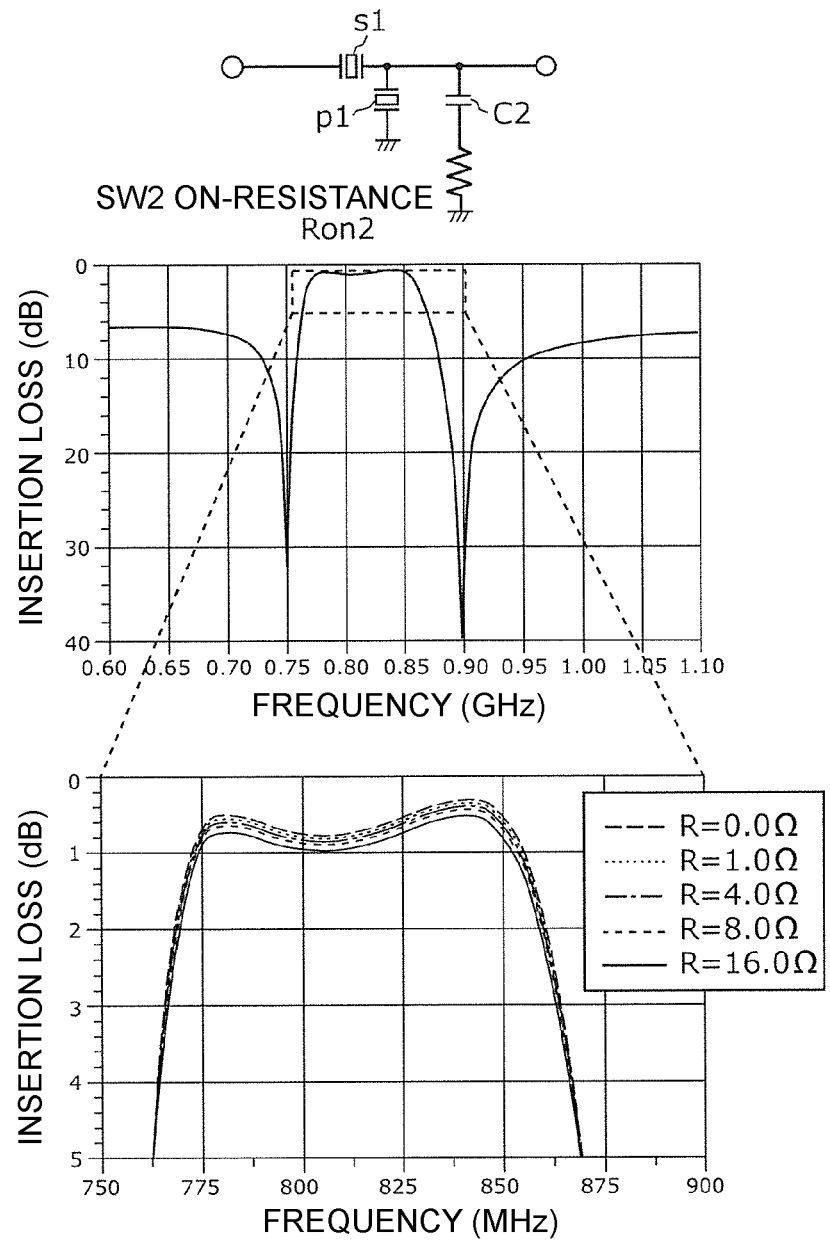

FIG. 10A shows graphs illustrating the relationship between the ON-resistance of a switch SW2 and the filter characteristics in a typical example.

Figure 10B:
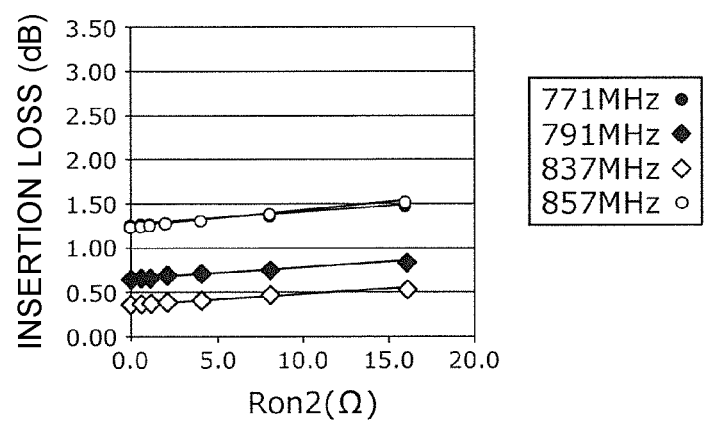

FIG. 10B is a graph illustrating the relationship between the ON-resistance of the switch SW2 and the insertion loss in the pass band in a typical example.

Figure 11:
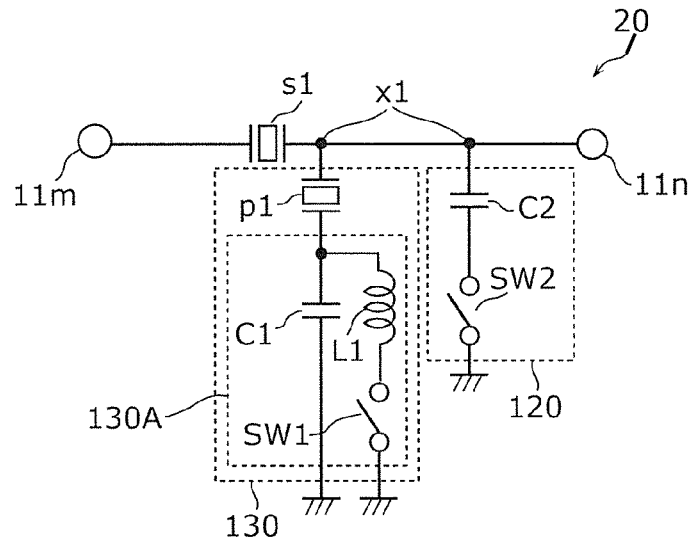

FIG. 11 is a circuit diagram of a radio-frequency filter according to a first modified example of the first embodiment.

Figure 12A:
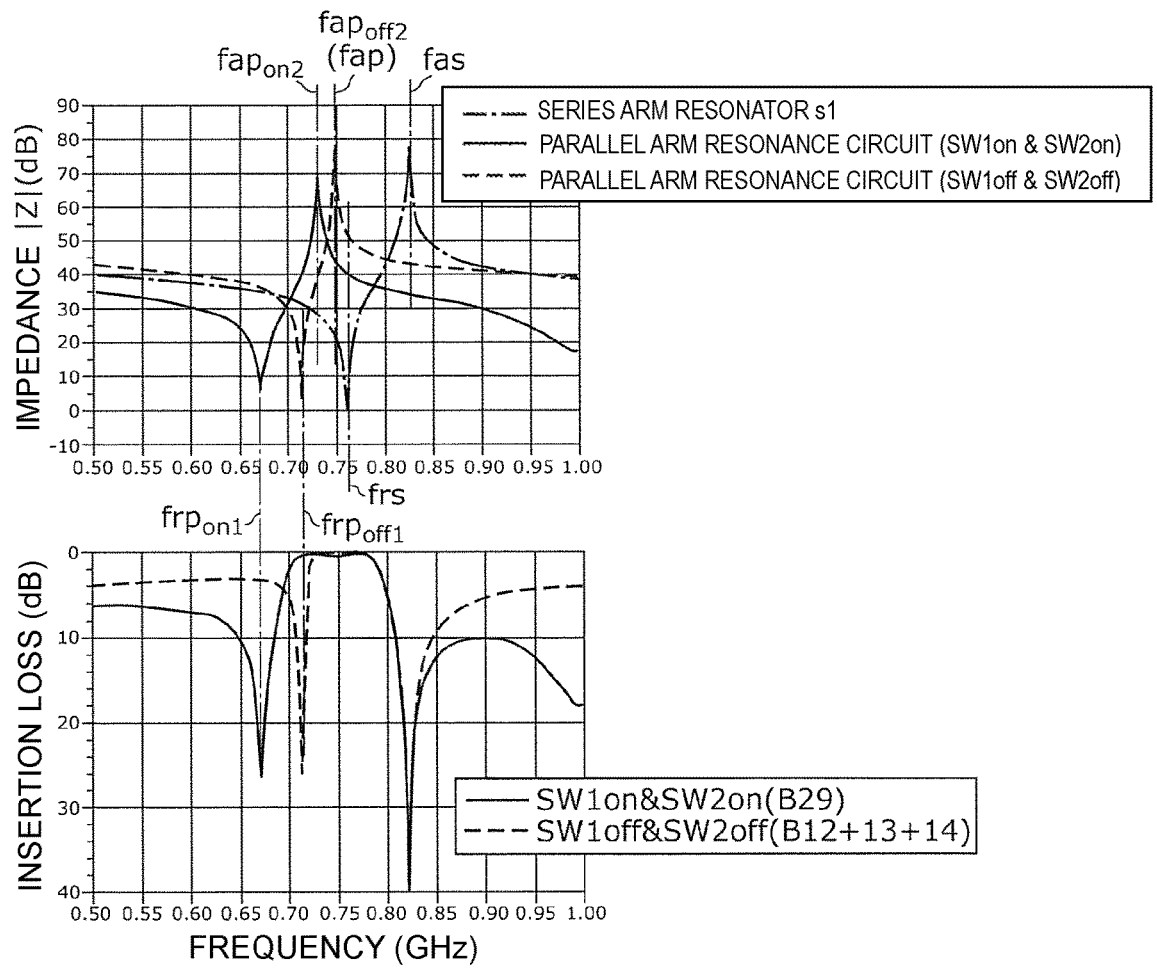

FIG. 12A shows graphs illustrating the impedance characteristics and the bandpass characteristics of the radio-frequency filter according to the first modified example of the first embodiment.

Figure 12B:
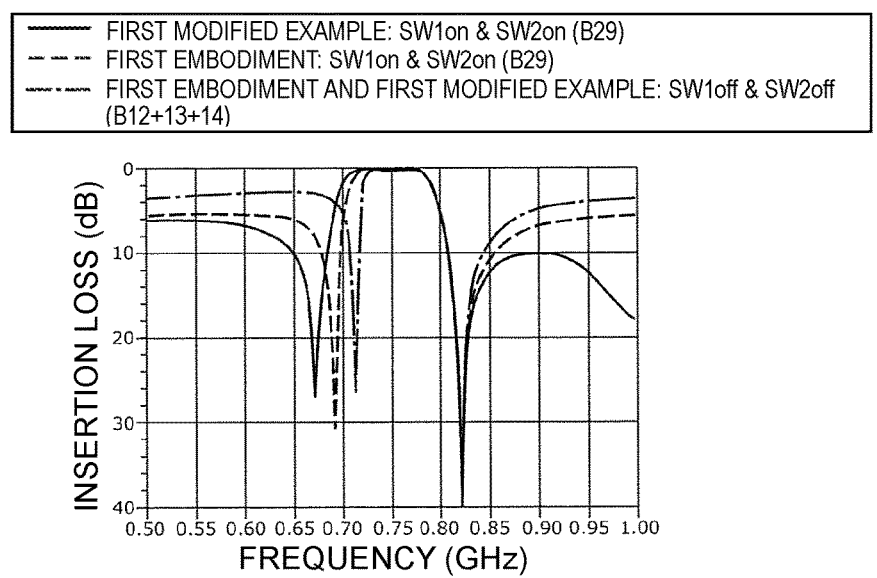

FIG. 12B is a graph illustrating a comparison between the bandpass characteristics of the radio-frequency filter of the first embodiment and those of the first modified example.

Figure 13A:
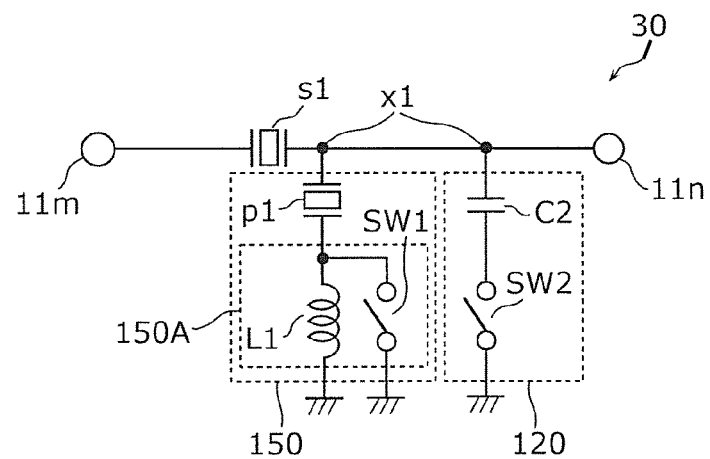

FIG. 13A is a circuit diagram illustrating an example of a radio-frequency filter according to a second embodiment.

Figure 13B:
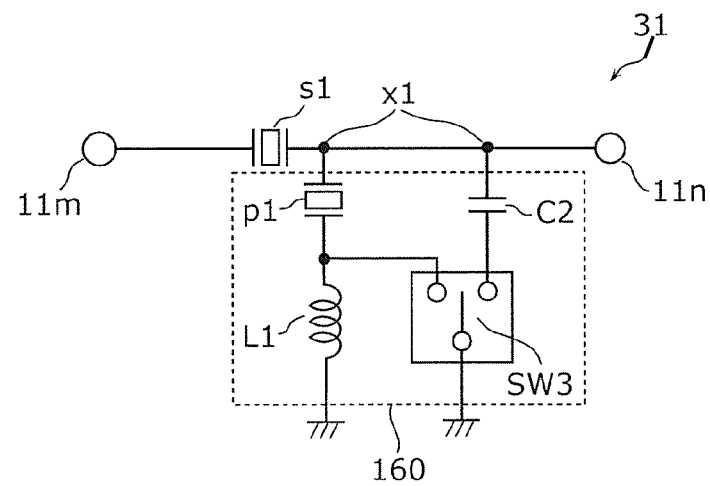

FIG. 13B is a circuit diagram of a radio-frequency filter according to a modified example of the second embodiment.

Figure 13C:
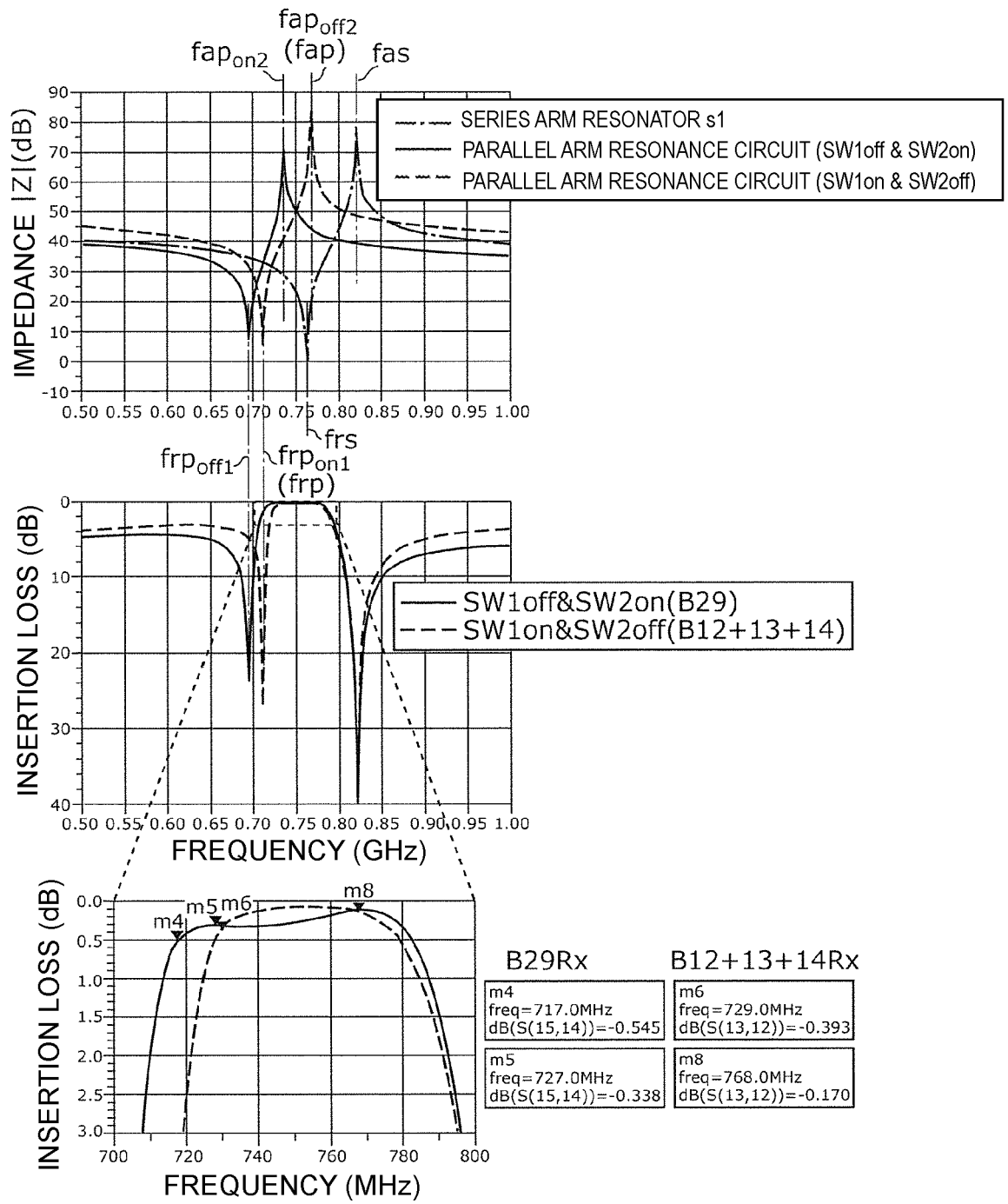

FIG. 13C shows graphs illustrating the impedance characteristics and the bandpass characteristics of the radio-frequency filter according to the second embodiment.

Figure 14A:
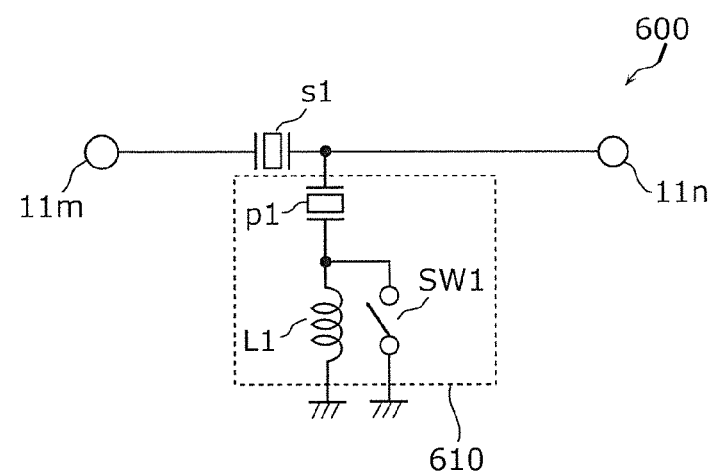

FIG. 14A is a circuit diagram illustrating an example of a radio-frequency filter according to a second comparative example.

Figure 14B:
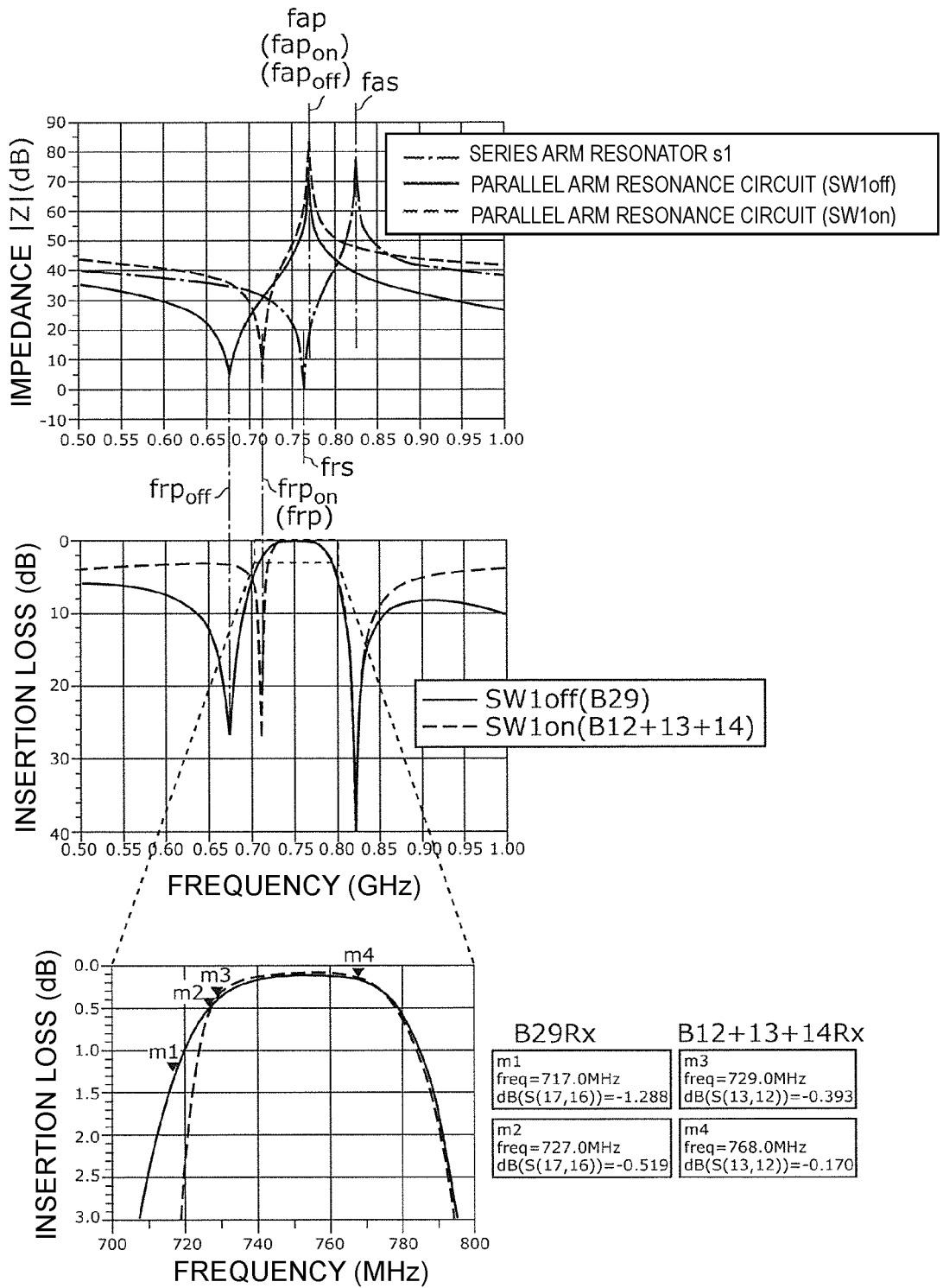

FIG. 14B shows graphs illustrating the impedance characteristics and the bandpass characteristics of the radio-frequency filter according to the second comparative example.

Figure 15:
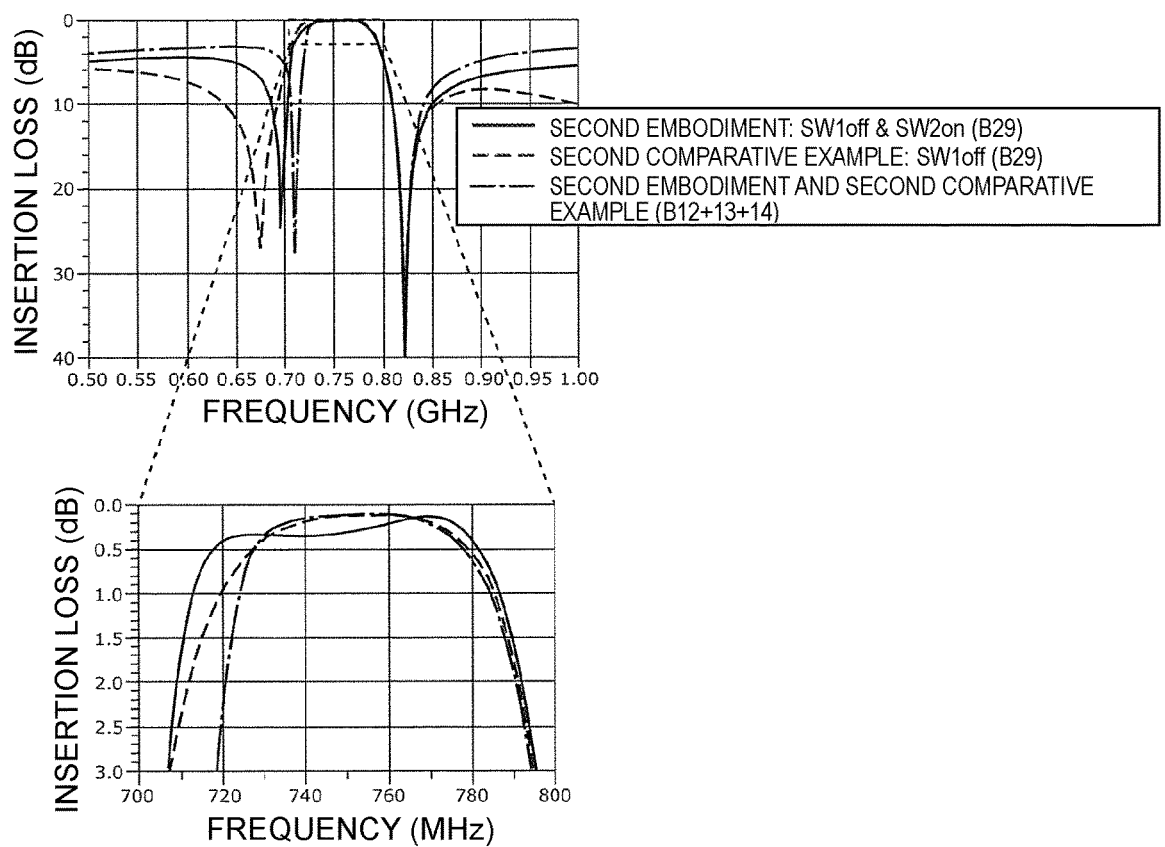

FIG. 15 shows graphs illustrating a comparison between the bandpass characteristics of the radio-frequency filter of the second embodiment and those of the second comparative example.

Figure 16:
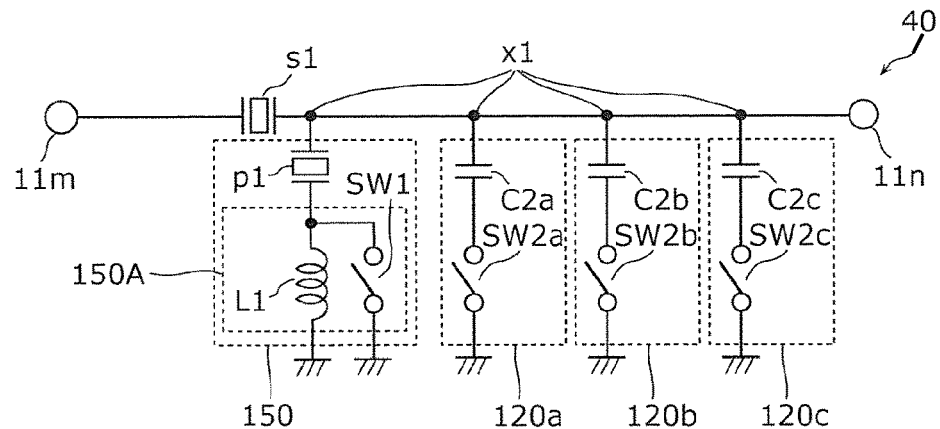

FIG. 16 is a circuit diagram illustrating an example of a radio-frequency filter according to a third embodiment.

Figure 17A:
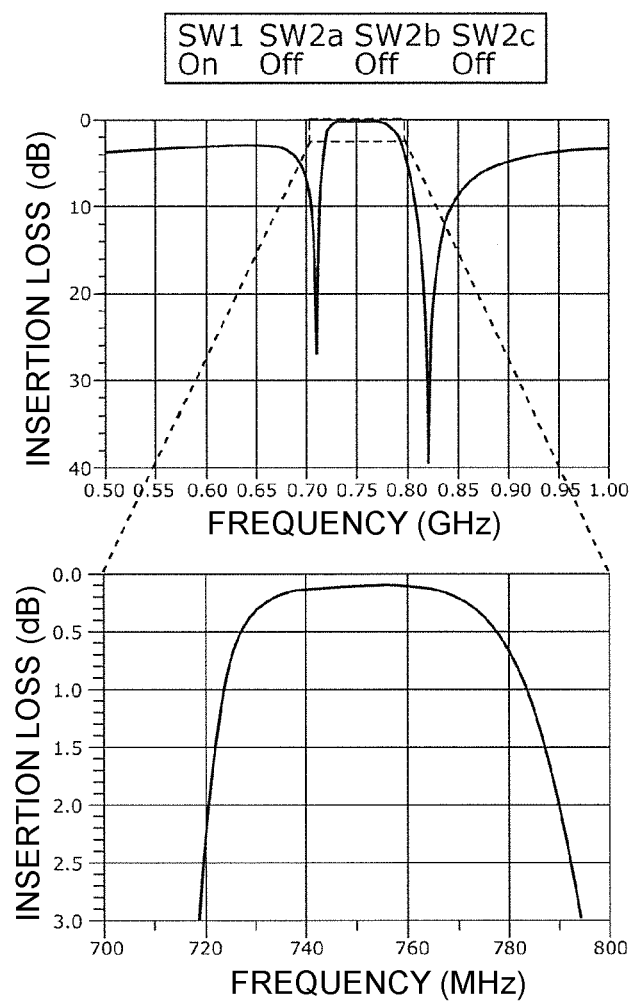

FIG. 17A shows graphs illustrating the filter characteristics when all second switches of the radio-frequency filter of the third embodiment are OFF.

Figure 17B:
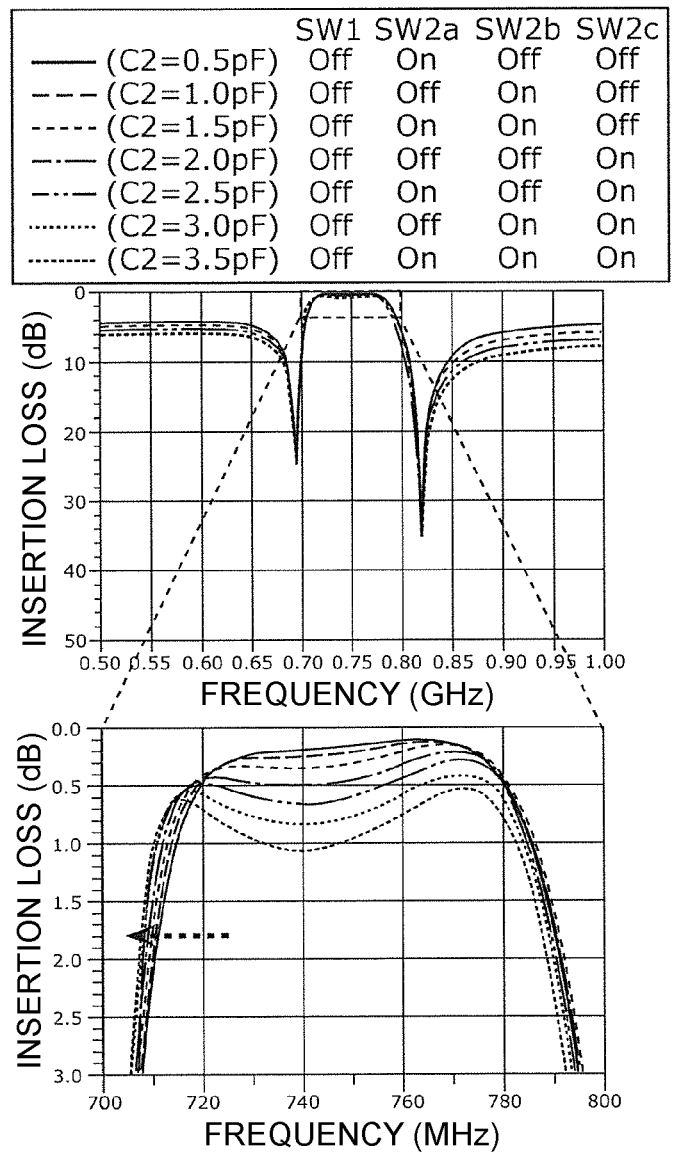

FIG. 17B shows graphs illustrating variations in the filter bandpass characteristics when the switches of the radio-frequency filter of the third embodiment are changed between ON and OFF.

Figure 18:
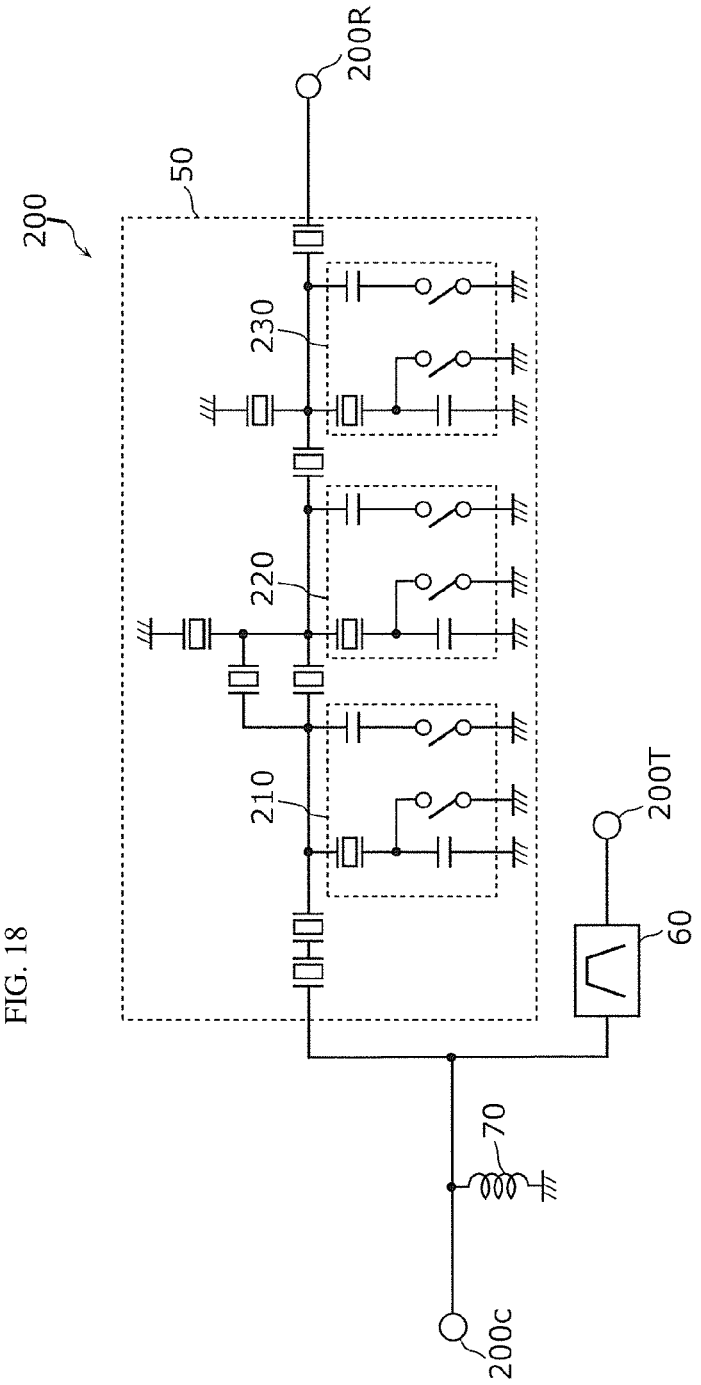

FIG. 18 is a circuit diagram of a multiplexer according to a fourth embodiment.

Figure 19:
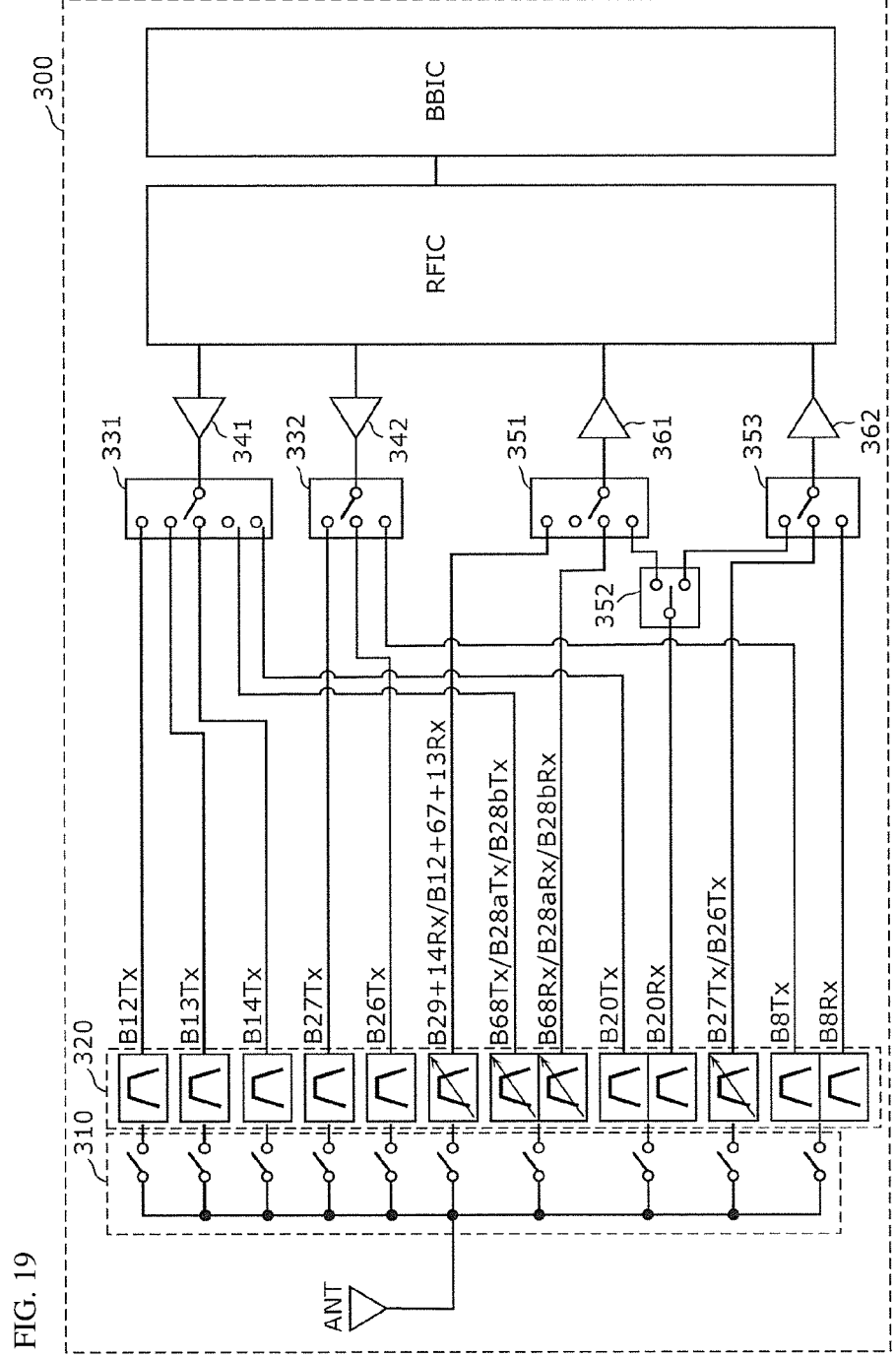

FIG. 19 is a schematic diagram of a communication apparatus and its adjacent circuits according to a fifth embodiment.

DETAILED DESCRIPTION OF THE DISCLOSURE

Embodiments of the present disclosure will be described below in detail by using examples and the drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios.

Unless otherwise stated, the resonant frequency of a resonator or a circuit is a resonant frequency for forming a pass band or an attenuation pole in the vicinity of the pass band of a filter which includes the resonator or the circuit. The resonant frequency is also the frequency of a "resonance point", which is the singularity point at which the impedance of the resonator or the circuit is minimized (ideally zero).

Unless otherwise stated, the anti-resonant frequency of a resonator or a circuit is an anti-resonant frequency for forming a pass band or an attenuation pole in the vicinity of the pass band of a filter which includes the resonator or the circuit. The anti-resonant frequency is also the frequency of an "anti-resonance point", which is the singularity point at which the impedance of the resonator or the circuit is maximized (ideally infinite).

In the following embodiments, a series arm circuit and a parallel arm circuit are defined as follows.

The parallel arm circuit is a circuit disposed between a ground and one node on a path connecting the first and second input/output terminals.

The series arm circuit is a circuit disposed between the first or second input/output terminal and a node on the above-described path to which the parallel arm circuit is connected, or a circuit disposed between one node on the above-described path to which one parallel arm circuit is connected and another node on the above-described path to which another parallel arm circuit is connected.

First Embodiment

[1.1 Configuration of Radio-Frequency Filter 10]

Figure 1A:
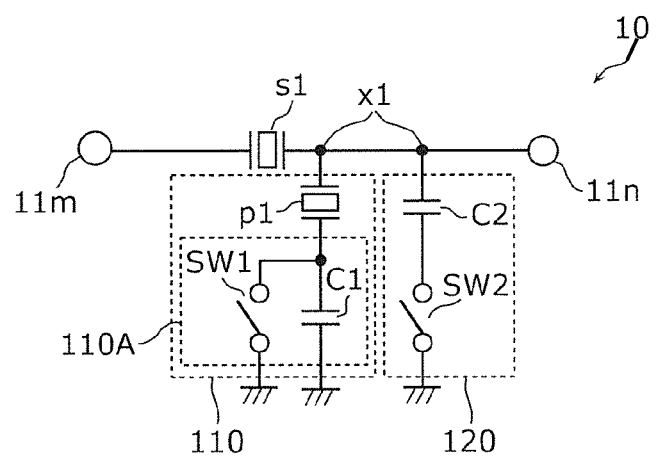
FIG. 1A is a circuit diagram illustrating an example of a radio-frequency filter according to a first embodiment.

FIG. 1A is a circuit diagram of a radio-frequency filter 10 according to a first embodiment. The radio-frequency filter 10 shown in FIG. 1A includes a series arm resonator s1 and parallel arm circuits 110 and 120.

The series arm resonator s1 is connected between an input/output terminal 11m (first input/output terminal) and an input/output terminal 11n (second input/output terminal). That is, the series arm resonator s1 is a resonator disposed on a series arm connecting the input/output terminals 11m and 11n. An element disposed on this series arm is not restricted to the series arm resonator s1, and any series arm circuit constituted by at least one acoustic wave resonator may be disposed on the series arm. In this embodiment, the series arm circuit is constituted by one acoustic wave resonator. However, it may be constituted by plural acoustic wave resonators. Examples of the series arm circuit constituted by plural acoustic wave resonators are a longitudinally coupled resonator constituted by plural acoustic wave resonators and plural series-connected resonators divided from one acoustic wave resonator. Using a longitudinally coupled resonator, for example, as the series arm circuit can respond to the required filter characteristics, such as enhanced attenuation. The series arm circuit may be constituted by an LC resonance circuit instead of an acoustic wave resonator.

The parallel arm circuit 110 is a first parallel arm circuit connected to a ground (reference terminal) and a node x1 provided on the path connecting the input-output terminals 11m and 11n. The parallel arm circuit 120 is a second parallel arm circuit connected to a node x1 and a ground.

The parallel arm circuit 110 includes a parallel arm resonator p1 and a variable frequency circuit 110A connected in series with each other between a node x1 and a ground. The variable frequency circuit 110A changes the resonant frequency of the parallel arm circuit 110.

The variable frequency circuit 110A includes a capacitor C1 (second capacitor and first impedance element) and a switch SW1 (first switch) connected in parallel with each other and connected to the parallel arm resonator p1.

The parallel arm circuit 120 includes a capacitor C2 (first capacitor) and a switch SW2 (second switch) connected in series with each other between a node x1 and a ground.

In the radio-frequency filter 10, the parallel arm resonator p1 and the variable frequency circuit 110A are connected in series with each other between a node x1 and a ground. The connection order of the parallel arm resonator p1 and the variable frequency circuit 110A is not particularly restricted to that shown in FIG. 1A and may be reversed. It is however desirable that the parallel arm resonator p1 is disposed closer to the node x1 than the switch SW1 is, as shown in FIG. 1A. If the switch SW1 is disposed closer to the node x1, the loss of the radio-frequency filter 10 is increased due to the resistance components of the switch SW1 when the switch is turned ON.

In the radio-frequency filter 10, the capacitor C2 and the switch SW2 are connected in series with each other between a node x1 and a ground. The connection order of the capacitor C2 and the switch SW2 is not particularly restricted to that shown in FIG. 1A and may be reversed. It is however desirable that the capacitor C2 is disposed closer to the node x1 than the switch SW2 is, as shown in FIG. 1A. If the switch SW1 of the parallel arm circuit 110, as well as the switch SW2, is connected to a ground, the same ground terminal can be used for the switches SW1 and SW2, thereby reducing the size of the switch circuit.

In this embodiment, the parallel arm resonator p1 forming a parallel arm resonance circuit is constituted by one acoustic wave resonator. However, the parallel arm resonator p1 may alternatively be constituted by plural series-connected resonators divided from one acoustic wave resonator.

Each of the series arm resonator s1 and the parallel arm resonator p1 may be any one of a surface acoustic wave filter and an acoustic wave filter using BAW (Bulk Acoustic Wave).

With this configuration, the size of each of the series arm resonator s1 and the parallel arm resonator p1 can be decreased, thereby reducing the size and the cost of the radio-frequency filter 10. The surface acoustic wave filter and the acoustic wave filter using BAW typically exhibit high Q-factor characteristics, thereby achieving small-loss, high-selectivity characteristics of the radio-frequency filter 10.

Each of the series arm resonator s1 and the parallel arm resonator p1 may be constituted by an LC resonance circuit including an inductor and a capacitor.

[1.2 Impedance Characteristics and Bandpass Characteristics of Radio-Frequency Filter 10]

Figure 1B:
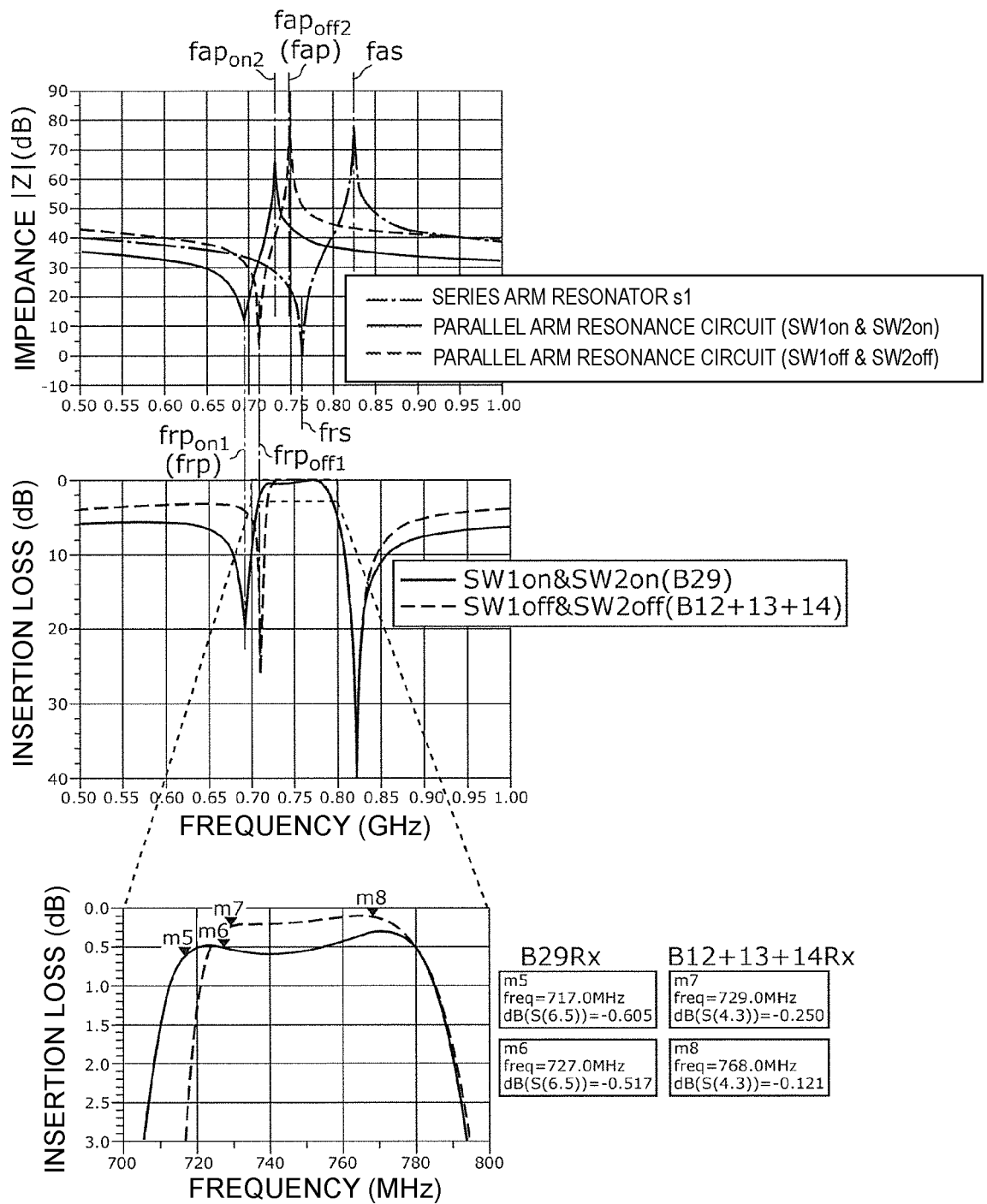
FIG. 1B shows graphs illustrating the impedance characteristics and the bandpass characteristics of the radio-frequency filter according to the first embodiment.

FIG. 1B shows graphs illustrating the impedance characteristics and the bandpass characteristics of the radio-frequency filter 10 according to the first embodiment.

The top section of FIG. 1B shows the resonance characteristics (impedance characteristics) of the series arm resonator s1 and the parallel arm resonance circuit, which is a combined circuit of the parallel arm circuits 110 and 120. Concerning the parallel arm resonance circuit, the resonance characteristics in two states, that is, in a state in which the switches SW1 and SW2 are both ON and in a state in which the switches SW1 and SW2 are both OFF, are shown.

The principle of the basic operation of a ladder surface acoustic wave filter constituted by the series arm resonator s1 and the parallel arm resonator p1 will first be explained below. That is, when the switch SW1 is ON and the switch SW2 is OFF, the circuit configuration shown in FIG. 1A is represented by a ladder basic circuit.

The parallel arm resonator p1 shown in FIG. 1A has a resonant frequency frp at which the impedance |Z| is minimized and an anti-resonant frequency fap (>frp) at which the impedance |Z| is maximized. The series arm resonator s1 has a resonant frequency frs at which the impedance |Z| is minimized and an anti-resonant frequency fas (>frs>frp) at which the impedance |Z| is maximized. To form a band pass filter by using a ladder resonator, the anti-resonant frequency fap of the parallel arm resonator p1 and the resonant frequency frs of the series arm resonator s1 are caused to approach each other. A region at and around the resonant frequency frp at which the impedance of the parallel arm resonator p1 approaches 0 serves as a lower-frequency elimination band. As the frequency increases, the impedance of the parallel arm resonator p1 becomes higher at and around the anti-resonant frequency fap and the impedance of the series arm resonator s1 approaches 0 at and around the resonant frequency frs. Then, a region between the anti-resonant frequency fap and the resonant frequency frs serves as a signal pass band in a signal path from the input/output terminal 11m to the input/output terminal 11n. As the frequency increases to be even higher, the impedance of the series arm resonator s1 becomes higher at and around the anti-resonant frequency fas, and a region at and around the anti-resonant frequency fas serves as a higher-frequency elimination band. That is, the pass band is formed by the anti-resonant frequency fap of the parallel arm resonator p1 forming the parallel arm resonance circuit and the resonant frequency frs of the series arm resonator s1 forming the series arm circuit. The attenuation pole of the lower-frequency elimination band is formed by the resonant frequency frp of the parallel arm resonator p1. The attenuation pole of the higher-frequency elimination band is formed by the anti-resonant frequency fas of the series arm resonator s1.

A description will now be given of the operation in the circuit configuration shown in FIG. 1A when the switches SW1 and SW2 are both ON.

As illustrated in the graph of the top section of FIG. 1B, the resonance characteristics of the series arm resonator s1 are not influenced by the switching of the switches SW1 and SW2 and exhibit the resonant frequency frs and the anti-resonant frequency fas. Concerning the parallel arm resonance circuit, when the switch SW1 is ON, the impedance characteristics are not influenced by the capacitor C1 and the resonant frequency $frp_{on1}$ of the parallel arm resonance circuit remains equal to the resonant frequency frp of the parallel arm resonator p1. When the switch SW2 is ON, the parallel arm resonance circuit is represented by a parallel circuit of the parallel arm resonator p1 and the capacitor C2.

Accordingly, the anti-resonant frequency of the parallel arm resonance circuit shifts to the anti-resonant frequency $fap_{on2}$, which is positioned on the lower-frequency side than the anti-resonant frequency fap of the single parallel arm resonator p1.

A description will now be given of the operation in the circuit configuration shown in FIG. 1A when the switches SW1 and SW2 are both OFF.

As illustrated in the graph of the top section of FIG. 1B, concerning the parallel arm resonance circuit, when the switches SW1 and SW2 are OFF, the parallel arm resonance circuit is represented by a series circuit of the parallel arm resonator p1 and the capacitor C1, and the resonant frequency of the parallel arm resonance circuit shifts to the resonant frequency $frp_{off1}$ on the higher-frequency side. The anti-resonant frequency $fap_{off2}$ of the parallel arm resonance circuit remains equal to the anti-resonant frequency fap of the parallel arm resonator p1.

To explain the advantages of the radio-frequency filter 10 according to this embodiment, the circuit configuration and filter characteristics of a radio-frequency filter according to a first comparative example, which is a known radio-frequency filter, will be discussed below by way of example.

Figure 2A:
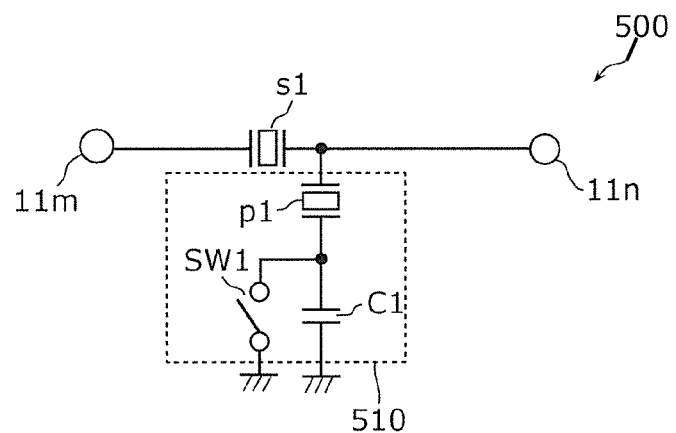
FIG. 2A is a circuit diagram illustrating an example of a radio-frequency filter according to a first comparative example.

FIG. 2A is a circuit diagram of a radio-frequency filter 500 according to the first comparative example. The radio-frequency filter 500 shown in FIG. 2A includes a series arm resonator s1 and a parallel arm circuit 510. The radio-frequency filter 500 shown in FIG. 2A is different from the radio-frequency filter 10 according to the first embodiment only in that it does not include a second parallel arm circuit constituted by a series circuit of the capacitor C2 and the switch SW2. The radio-frequency filter 500 according to the first comparative example will be described below mainly by referring to the points different from the radio-frequency filter 10 while omitting the same points as those of the radio-frequency filter 10.

Figure 2B:
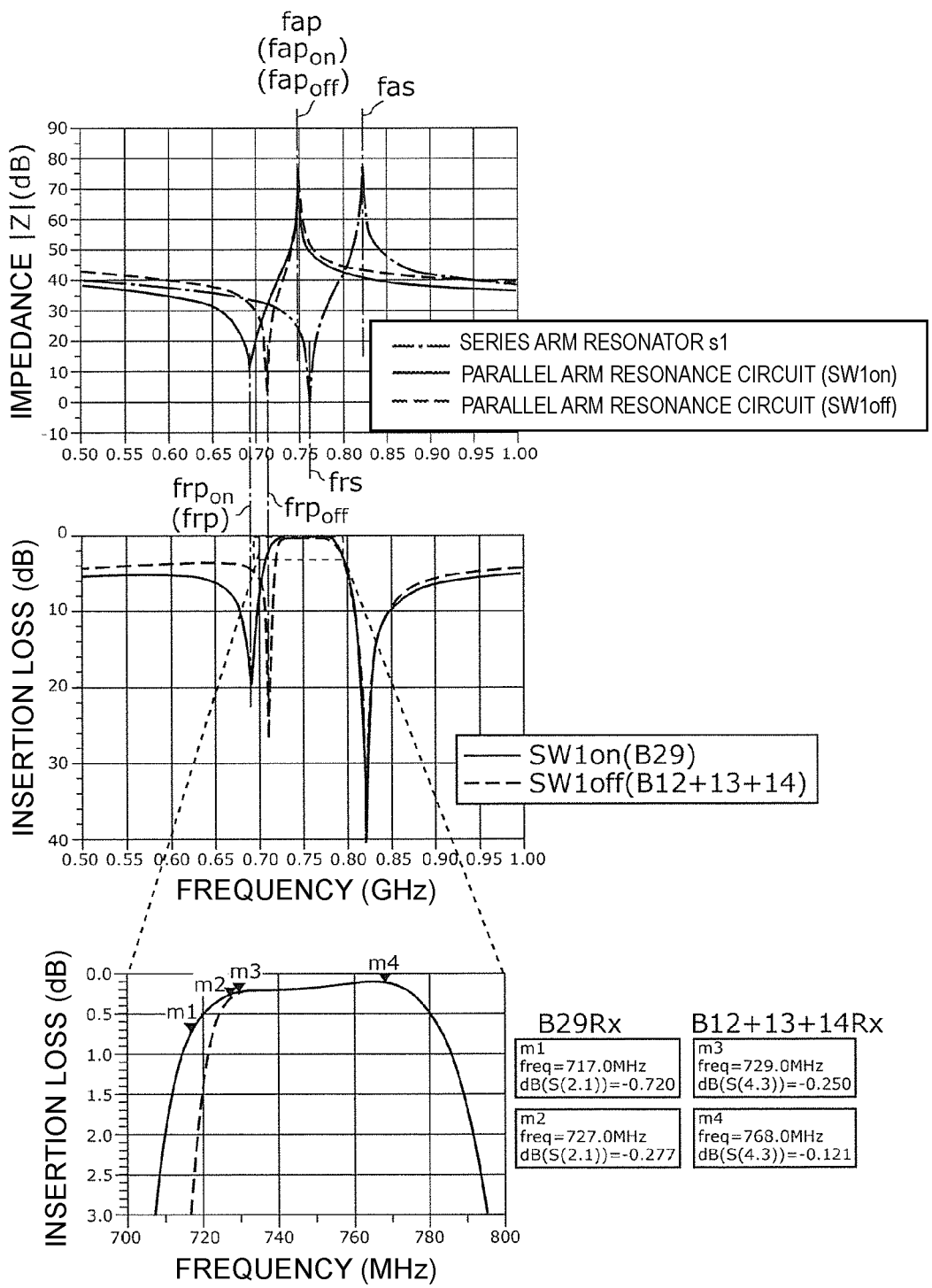
FIG. 2B shows graphs illustrating the impedance characteristics and the bandpass characteristics of the radio-frequency filter according to the first comparative example.

FIG. 2B shows graphs illustrating the impedance characteristics and the bandpass characteristics of the radio-frequency filter 500 according to the first comparative example. The top section of FIG. 2B shows the resonance characteristics (impedance characteristics) of the series arm resonator s1 and the parallel arm resonance circuit (parallel arm circuit 510). Concerning the parallel arm resonance circuit, the resonance characteristics in two states, that is, in a state in which the switch SW1 is ON and in a state in which the switch SW1 is OFF, are shown.

A description will first be given of the operation in the circuit configuration shown in FIG. 2A when the switch SW1 is ON.

As illustrated in the graph of the top section of FIG. 2B, the resonance characteristics of the series arm resonator s1 are not influenced by the switching of the switch SW1 and exhibit the resonant frequency frs and the anti-resonant frequency fas. Concerning the parallel arm resonance circuit, when the switch SW1 is ON, the impedance characteristics are not influenced by the capacitor C1, and the resonant frequency $frp_{on}$ of the parallel arm resonance circuit remains equal to the resonant frequency frp of the parallel arm resonator p1. That is, when the switch SW1 is ON, the resonance characteristics of the parallel arm resonance circuit are substantially the same as those of the parallel arm resonator p1. The anti-resonant frequency $fap_{on}$ of the parallel arm resonance circuit remains equal to the anti-resonant frequency fap of the parallel arm resonator p1. When the switch SW1 is OFF, the parallel arm resonance circuit is represented by a series circuit of the parallel arm resonator p1 and the capacitor C1, and the resonant frequency of the parallel arm resonance circuit shifts to the resonant frequency $frp_{off}$ on the higher-frequency side. The anti-resonant frequency $fap_{off}$ of the parallel arm resonance circuit remains equal to the anti-resonant frequency fap of the parallel arm resonator p1.

That is, the radio-frequency filter 500 forms a variable frequency filter in which the attenuation pole on the lower-frequency side of the pass band shifts to the lower-frequency side when the switch SW1 is ON and shifts to the higher-frequency side when the switch SW1 is OFF. The attenuation pole on the higher-frequency side of the pass band does not change regardless of whether the switch SW1 is ON or OFF.

As described above, in the radio-frequency filter 500 according to the first comparative example, when the switch SW1 is switched from ON to OFF, only the resonant frequency shifts to the higher-frequency side, and the anti-resonant frequency remains the same in the parallel arm circuit 510, as represented by the graph of the top section of FIG. 2B.

As shown in the graphs in the middle and bottom sections of FIG. 2B, the bandpass characteristics when the switch SW1 is OFF indicate that the attenuation pole on the lower-frequency side of the pass band shifts to the higher-frequency side compared with the bandpass characteristics when the switch SW1 is ON. In this case, the sharpness of the attenuation slope on the lower-frequency side of the pass band is changed. In other words, in regard to the bandpass characteristics, the sharpness on the lower-frequency side of the pass band when the switch SW1 is ON is less sharp than that when the switch SW1 is OFF. This increases the insertion loss at the low edge of the pass band.

FIG. 2B shows an example in which the radio-frequency filter 500 is applied to a variable frequency filter that switches the frequency band between LTE Band 29Rx (717 to 727 MHz) and Band (12+13+14)Rx (729 to 768 MHz). When the switch SW1 is OFF (when Band (12+13+14)Rx is selected), the insertion loss at the low edge of the pass band (729 MHz) is 0.25 dB, while the insertion loss at the high edge of the pass band (768 MHz) is 0.121 dB. The insertion loss in the pass band is maintained in a well-balanced manner. When the switch SW1 is ON (when Band 29Rx is selected), while the insertion loss at the high edge of the pass band (727 MHz) is 0.277 dB, the insertion loss at the low edge of the pass band (717 MHz) is as high as 0.72 dB (the highest insertion loss in the pass band is 0.72 dB).

Having focused on the increased insertion loss at the low edge of the pass band as a result of shifting only the attenuation pole, the present inventor has conceived that shifting of the attenuation slope as well as the attenuation pole may be able to regulate an increase in the insertion loss at the low edge of the pass band.

A description will return back to the radio-frequency filter 10 of this embodiment.

In the radio-frequency filter 10 according to this embodiment, as shown in the graph of the top section of FIG. 1B, when the switches SW1 and SW2 are both ON, the resonant frequency $frp_{on1}$ of the parallel arm resonance circuit is positioned on the lower-frequency side, and also, the anti-resonant frequency of the parallel arm resonance circuit shifts to the anti-resonant frequency $fap_{on2}$ on the lower-frequency side. That is, when the switches SW1 and SW2 are both ON, if the attenuation pole on the lower-frequency side of the pass band is positioned on the lower-frequency side, the insertion loss at the low edge of the pass band is less likely to increase, as represented by the bandpass characteristics in the middle and bottom sections of FIG. 1B.

Figure 3:
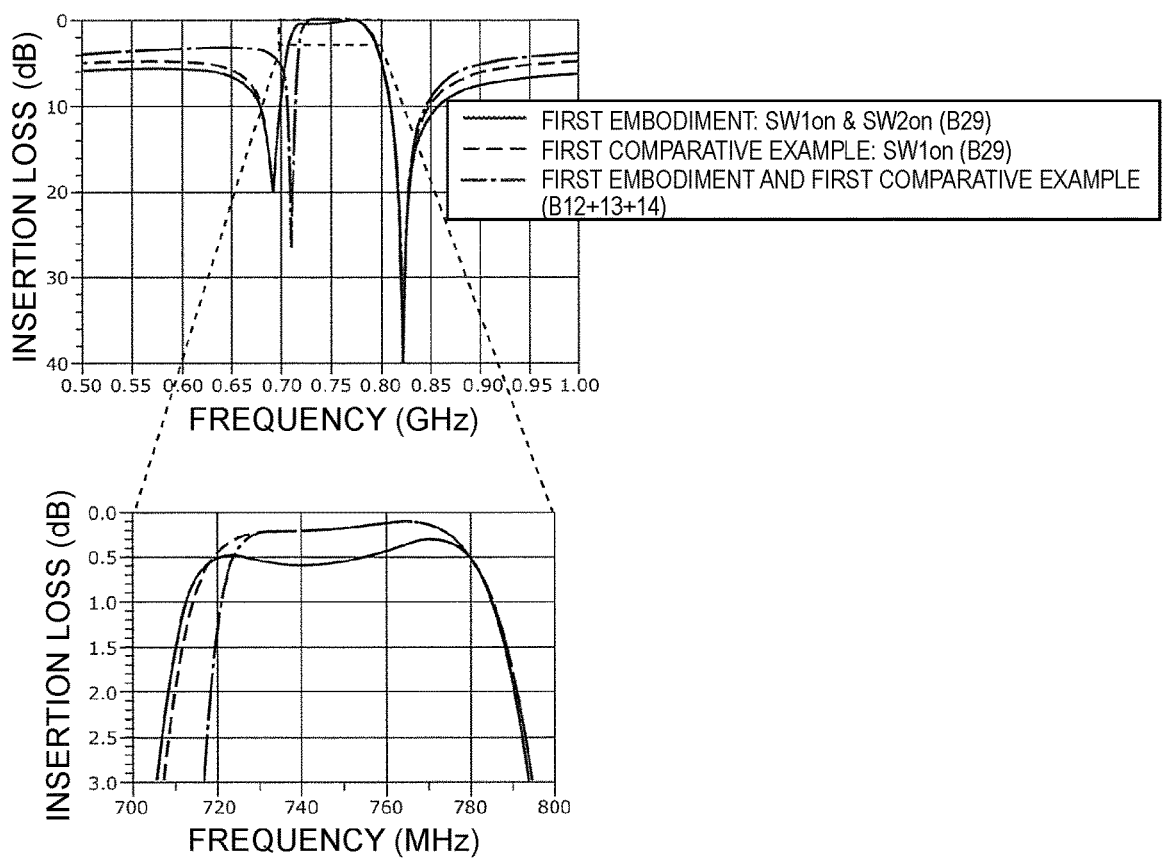
FIG. 3 shows graphs illustrating a comparison between the bandpass characteristics of the radio-frequency filter of the first embodiment and those of the first comparative example.

FIG. 3 shows graphs illustrating a comparison between the bandpass characteristics of the radio-frequency filter of the first embodiment and those of the first comparative example.

FIG. 1B shows an example in which the radio-frequency filter 10 is applied to a variable frequency filter that switches the frequency band between LTE Band 29Rx (717 to 727 MHz) and Band (12+13+14)Rx (729 to 768 MHz). When the switch SW1 is OFF (when Band (12+13+14)Rx is selected), the insertion loss at the low edge of the pass band (729 MHz) is 0.25 dB, while the insertion loss at the high edge of the pass band (768 MHz) is 0.121 dB. The insertion loss in the pass band is maintained in a well-balanced manner. When the switch SW1 is ON (when Band 29Rx is selected), while the insertion loss at the high edge of the pass band (727 MHz) is 0.517 dB, the insertion loss at the low edge of the pass band (717 MHz) is 0.605 dB. The insertion loss in the pass band is also maintained in a well-balanced manner (the highest insertion loss in the pass band is 0.605 dB).

The radio-frequency filter 10 according to this embodiment forms a tunable filter which is constituted by a series arm circuit (series arm resonator s1) and a parallel arm resonance circuit (the combined circuit of parallel arm circuits 110 and 120) and changes the frequency band as a result of switching the switches SW1 and SW2 between ON and OFF. The resonant frequency of the series arm circuit and the anti-resonant frequency of the parallel arm resonance circuit determine the pass band. The resonant frequency of the parallel arm resonance circuit determines the attenuation pole on the lower-frequency side of the pass band, and the anti-resonant frequency of the series arm circuit determines the attenuation pole on the higher-frequency side of the pass band.

When the switch SW1 is ON, the characteristics of the parallel arm circuit 110 are not influenced by the capacitor C1 and remain equal to those of the parallel arm resonator p1. When the switch SW1 is OFF, the characteristics of the parallel arm circuit 110 are influenced by the capacitor C1 and exhibit the combined characteristics of the parallel arm resonator p1 and the capacitor C1. The resonant frequency of the parallel arm circuit 110 shifts from the resonant frequency $frp_{on1}$ to the resonant frequency $frp_{off1}$. Hence, the frequency of the attenuation pole on the lower-frequency side of the pass band is changed.

When the switch SW2 is ON, the capacitor C2 functions, and the anti-resonant frequency of the parallel arm resonance circuit shifts to the lower-frequency side (shifts from the anti-resonant frequency $frp_{on2}$ to the resonant frequency $frp_{off2}$). When the switch SW2 is OFF, the capacitor C2 does not function, and the parallel arm resonance circuit exhibits the characteristics of only the parallel arm circuit 110.

That is, the frequency of the attenuation pole determined by the resonant frequency of the parallel arm resonance circuit can be changed by using the switch SW1, and also, the frequency of the pass band determined by the anti-resonant frequency of the parallel arm resonance circuit can be changed by using the switch SW2. As a result of the switch SW2 being switched between ON and OFF, the frequency of the pass band becomes variable. When the frequency of the pass band is shifted to the lower-frequency side, it is also possible to change each of the pass band and the attenuation band substantially without increasing the insertion loss at the low edge of the pass band.

The ranges by which the frequency of the pass band and that of the attenuation band of the radio-frequency filter 10 are variable (hereinafter called the variable frequency range of the pass band and that of the attenuation band) are determined by the constants of the capacitors C1 and C2. As the constant of the capacitor C1 is smaller, the variable frequency range of the pass band and that of the attenuation band become wider. As the constant of the capacitor C2 is greater, the variable frequency range of the pass band becomes wider. The constants of the capacitors C1 and C2 are thus suitably determined in accordance with the frequency specifications demanded for the radio-frequency filter 10. The capacitors C1 and C2 may each be a variable capacitor, such as varicap or a DTC (Digitally Tunable Capacitor).

The switches SW1 and SW2 are SPST (Single Pole Single Throw) switch elements, for example. The switches SW1 and SW2 are switched between ON and OFF by a control signal outputted from a controller so that the connection nodes of the switches SW1 and SW2 are connected or disconnected.

For example, the switches SW1 and SW2 may be FET (Field Effect Transistor) switches made of GaAs or CMOS (Complementary Metal Oxide Semiconductor) or diode switches. This makes it possible to constitute each of the switches SW1 and SW2 by one FET switch or one diode switch, thereby reducing the size of the radio-frequency filter 10.

In the radio-frequency filter 10 according to this embodiment, the mode in which the switches SW1 and SW2 are turned ON at the same time and the mode in which the switches SW1 and SW2 are turned OFF at the same time have been discussed. However, other modes may be selected. That is, a mode in which the switch SW1 is ON and the switch SW2 is OFF and a mode in which the switch SW1 is OFF and the switch SW2 is ON may be selected.

Figure 4:
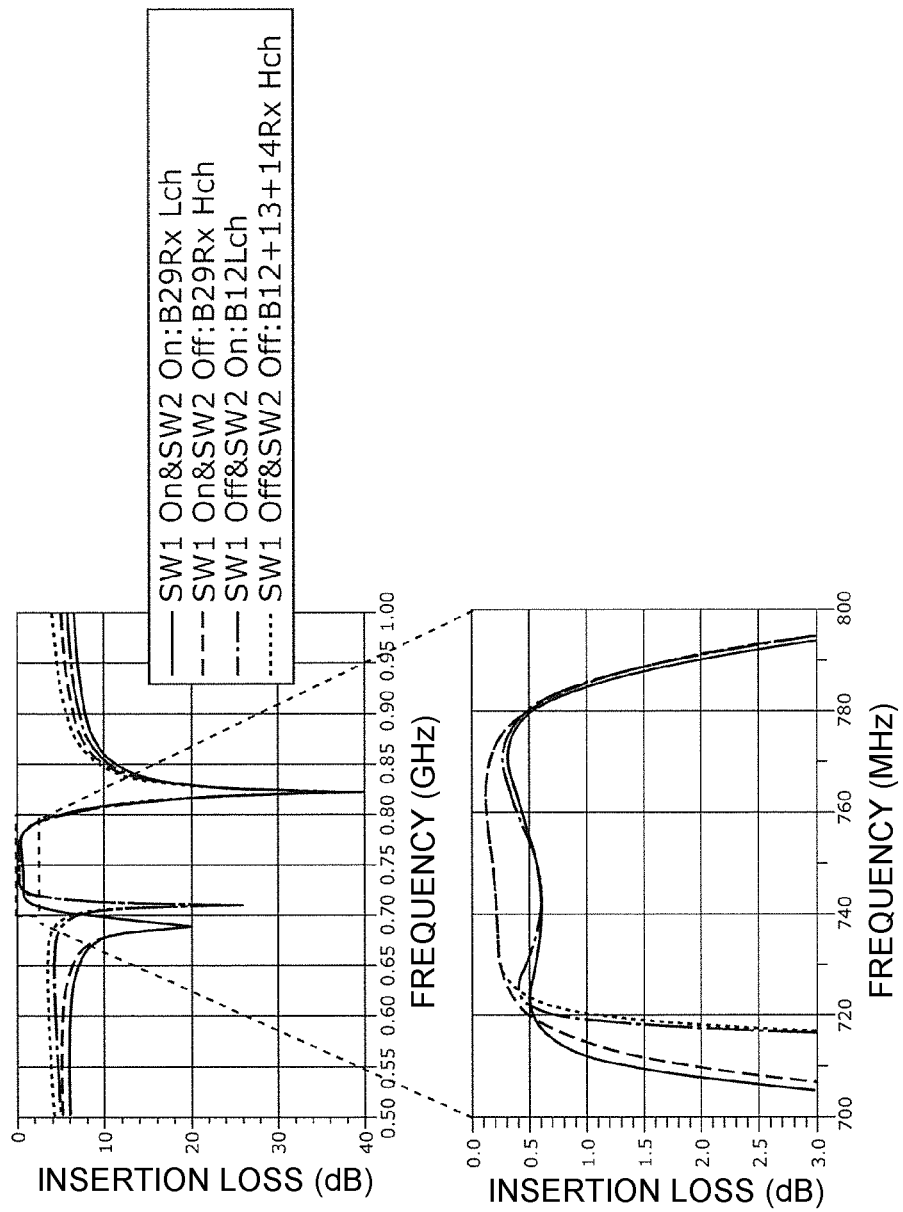
FIG. 4 shows graphs illustrating variations in the filter bandpass characteristics when the ON/OFF states of switches of the radio-frequency filter according to the first embodiment are changed.

FIG. 4 shows graphs illustrating variations in the filter bandpass characteristics when the ON/OFF states of the switches of the radio-frequency filter 10 of the first embodiment are changed. As shown in FIG. 4, for example, the radio-frequency filter 10 is used for (1) the low channel of Band 29Rx when the switches SW1 and SW2 are ON, (2) the high channel of Band 29Rx when the switch SW1 is ON and the switch SW2 is OFF, (3) the low channel of Band 12 when the switch SW1 is OFF and the switch SW2 is ON, and (4) the high channel of Band (12+13+14)Rx when the switches SW1 and SW2 are OFF. In this manner, as a result of individually changing the ON/OFF states of the switches, it is possible to reduce the insertion loss in accordance with the band and the channel to be used.

[1.3 Resonance Analysis Concerning Resonator Equivalent Circuit]

The resonance characteristics of a resonator forming the radio-frequency filter 10 of this embodiment will be explained below by using equivalent circuits.

Figure 5A:
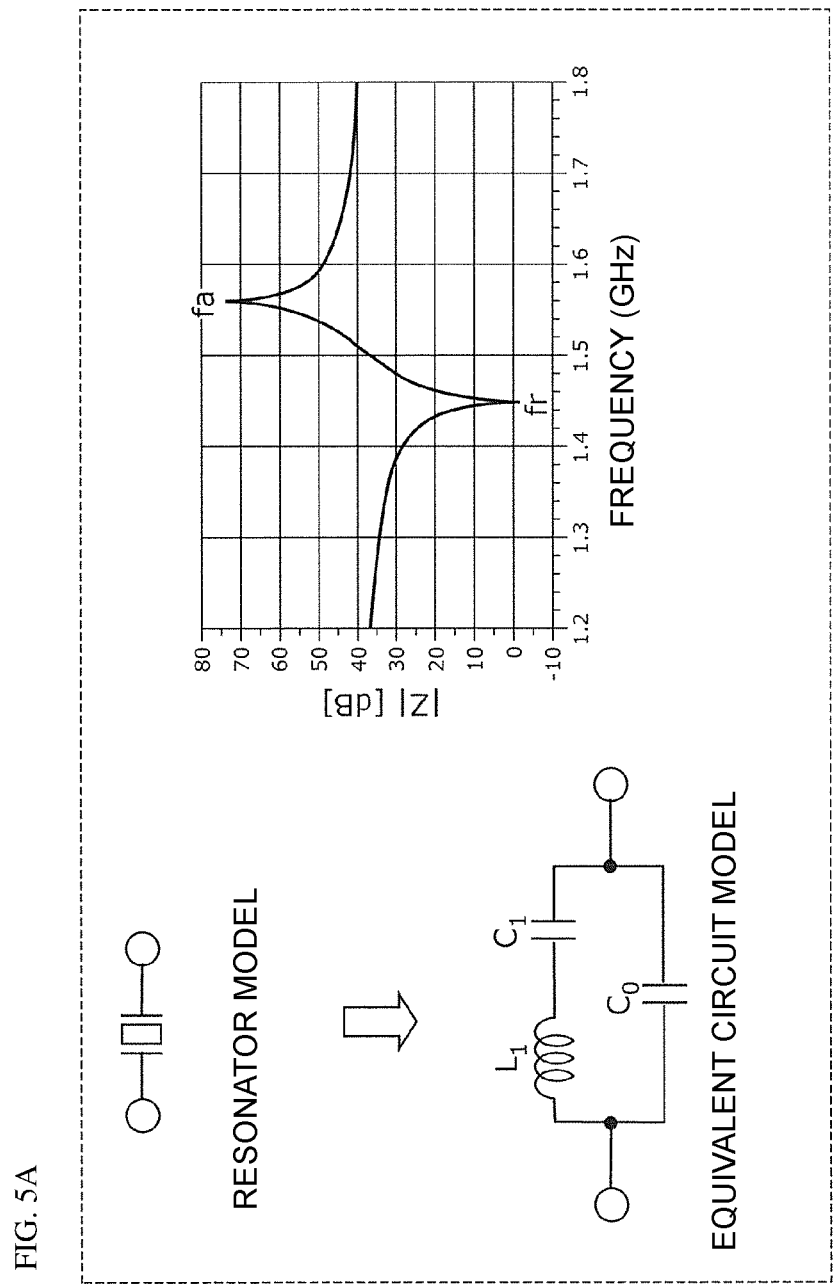
FIG. 5A illustrates an equivalent circuit model of a single resonator and the resonance characteristics thereof.

FIG. 5A illustrates an equivalent circuit model of a single resonator and the resonance characteristics thereof. As shown in FIG. 5A, the resonator can be represented by a parallel circuit of a capacitor $C_0$ and a series circuit of a capacitor $C_1$ and an inductor $L_1$. The capacitor $C_0$ is the electrostatic capacity of the resonator.

In this equivalent circuit, the resonant frequency fr of the resonator is determined by the series circuit of the capacitor $C_1$ and the inductor $L_1$. The resonant frequency fr is the frequency at which the impedance of the equivalent circuit is 0. Accordingly, the resonant frequency fr is expressed by equation 2 as a result of solving equation 1.

[Math. 1]

$$Z = 0 = j\omega L_1 + \frac{1}{j\omega C_1} \quad \text{(Equation 1)}$$

[Math. 2]

$$f_r = \frac{1}{2\pi\sqrt{L_1 C_1}} \quad \text{(Equation 2)}$$

The anti-resonant frequency fa of the resonator is the frequency at which the admittance Y of the above-described equivalent circuit is 0. Accordingly, the anti-resonant frequency fa is expressed by equation 4 as a result of solving equation 3.

[Math. 3]

$$Y = \frac{1}{Z} = 0 = \frac{1}{\frac{1}{j\omega C_0}} + \frac{1}{j\omega L_1 + \frac{1}{j\omega C_1}} \quad \text{(Equation 3)}$$

[Math. 4]

$$f_a = \frac{\sqrt{1 + \frac{C_1}{C_0}}}{2\pi\sqrt{L_1 C_1}} = f_r \sqrt{1 + \frac{C_1}{C_0}} \quad \text{(Equation 4)}$$

According to equations 2 and 4, as shown in the graph on the right side of FIG. 5A, the anti-resonant frequency fa is positioned on the higher-frequency side than the resonant frequency fr.

That is, the resonance characteristics of the parallel arm circuit 110 shown in FIG. 1A when the switch SW1 is ON are represented only by those of the parallel arm resonator p1, and exhibit one resonant frequency and one anti-resonant frequency positioned on the higher-frequency side than the resonant frequency.

A description will now be given, by using an equivalent circuit model, of the resonance characteristics of the parallel arm circuit 110 when an impedance element (capacitor C1 in this embodiment) is connected in series with the parallel arm resonator p1 as a result of changing the switch SW1 to be OFF.

Figure 5B:
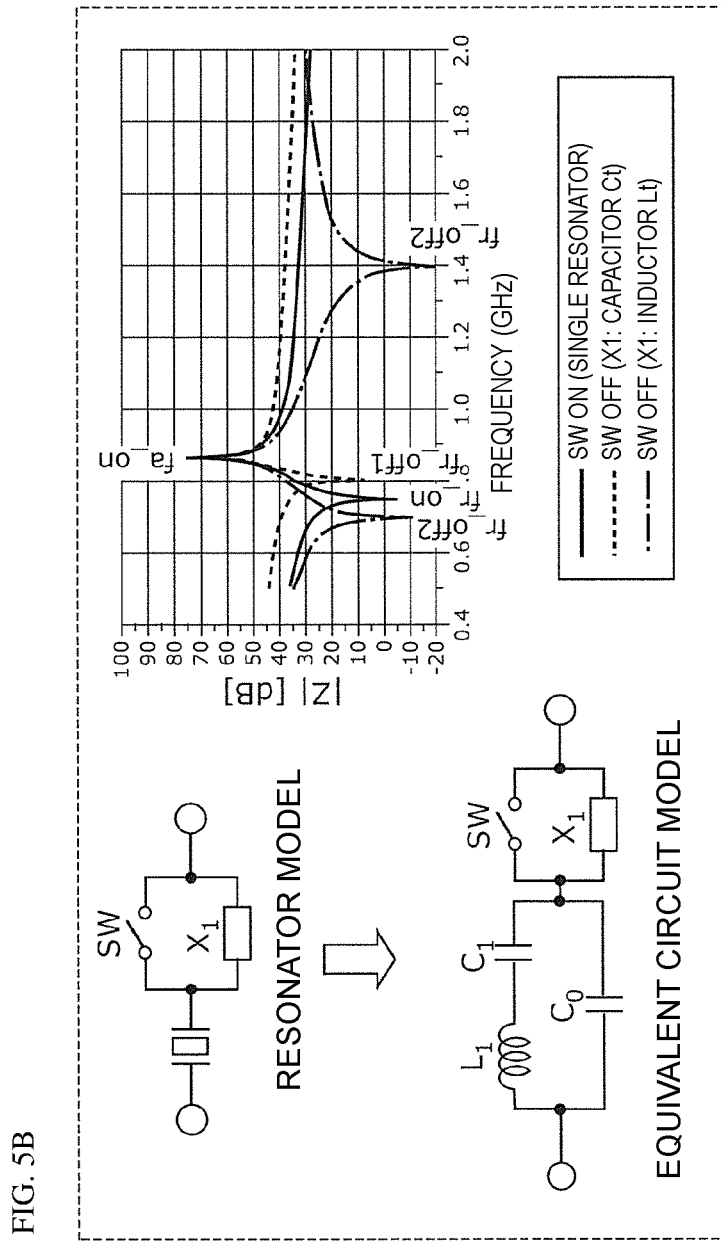
FIG. 5B illustrates an equivalent circuit model in which an impedance element is connected in series with a resonator and also illustrates the resonance characteristics thereof.

FIG. 5B illustrates an equivalent circuit model in which an impedance element $X_1$ is connected in series with a resonator, and also illustrates the resonance characteristics thereof. As shown in FIG. 5B, the resonator is represented by a parallel circuit of a capacitor $C_0$ and a series circuit of a capacitor $C_1$ and an inductor $L_1$. The capacitor $C_0$ is the electrostatic capacity of the resonator. A parallel circuit of the impedance element $X_1$ and a switch SW is connected to this resonator.

The resonance characteristics of the above-described equivalent circuit when the switch SW is ON will first be discussed. When the switch SW is ON, the resonant frequency fr_on and the anti-resonant frequency fa_on respectively remain equal to the resonant frequency fr and the anti-resonant frequency fa shown in FIG. 5A, and are expressed by equations 5 and 6, respectively. In the radio-frequency filter 10 according to this embodiment, when the capacitor C2 is connected in parallel with the parallel arm resonator p1 (when the switch SW2 is ON), the capacitor C2 is connected to the capacitor $C_0$, which is the electrostatic capacity of the parallel arm resonator p1. Accordingly, $C_0$ in equation 4 is replaced by $C_0+C2$, and the anti-resonant frequency fa shifts to the lower-frequency side.

[Math. 5]

$$f_{r\_on} = \frac{1}{2\pi\sqrt{L_1 C_1}} \quad \text{(Equation 5)}$$

[Math. 6]

$$f_{a\_on} = \frac{\sqrt{1 + \frac{C_1}{C_0}}}{2\pi\sqrt{L_1 C_1}} = f_{r\_on}\sqrt{1 + \frac{C_1}{C_0}} \quad \text{(Equation 6)}$$

The resonance characteristics of the above-described equivalent circuit when the switch SW is OFF will be discussed. In this case, (1) the resonance characteristics when the impedance element $X_1$ is a capacitor and (2) the resonance characteristics when the impedance element $X_1$ is an inductor will be described.

(1) When the Impedance Element $X_1$ is a Capacitor $C_t$

The resonant frequency fr_off1 when the switch SW is OFF is the frequency at which the impedance Z of the above-described equivalent circuit is 0. Accordingly, the resonant frequency fr_off1 is expressed by equation 8 as a result of solving equation 7.

[Math. 7]

$$Z = 0 = \frac{1}{\frac{1}{\frac{1}{j\omega C_0}} + \frac{1}{j\omega L_1 + \frac{1}{j\omega C_1}}} + \frac{1}{j\omega C_t} \quad \text{(Equation 7)}$$

[Math. 8]

$$f_{r\_off1} = \frac{\sqrt{\frac{C_0 + C_1 + C_t}{L_1 C_1 C_t + L_1 C_0 C_t}}}{2\pi} \quad \text{(Equation 8)}$$

The anti-resonant frequency fa_off1 (not shown) when the switch SW is OFF is the same as the anti-resonant frequency fa_on when the switch SW is ON, and is expressed by equation 9.

[Math. 9]

$$f_{a\_off1} = \frac{\sqrt{1 + \frac{C_1}{C_0}}}{2\pi\sqrt{L_1 C_1}} \quad \text{(Equation 9)}$$

According to equations 5, 6, 8, and 9, the graph on the right side of FIG. 5B shows that, when the impedance element $X_1$ is a capacitor, the anti-resonant frequencies fa_on and fa_off1 coincide with each other regardless of whether the switch SW is ON or OFF, and the resonant frequency (fr_off1) when the switch SW is OFF is positioned on the higher-frequency side than the resonant frequency (fr_on) when the switch SW is ON.

(2) When the Impedance Element $X_1$ is an Inductor $L_t$

The resonant frequency fr_off2 when the switch SW is OFF is the frequency at which the impedance Z of the above-described equivalent circuit is 0. Accordingly, the resonant frequency fr_off2 is expressed by equation 11 as a result of solving equation 10.

[Math. 10]

$$Z = 0 = \cfrac{1}{\cfrac{1}{\cfrac{1}{j\omega C_0} + \cfrac{1}{j\omega L_1 + \cfrac{1}{j\omega C_1}}}} + j\omega L_t \quad \text{(Equation 10)}$$

[Math. 11]

$$f_{r\_off2} = \frac{\sqrt{\frac{-b \pm \sqrt{b^2 - 4ac}}{2a}}}{2\pi} \quad \text{(Equation 11)}$$
$$a = L_1 L_t C_0 C_1$$
$$b = L_1 C_1 - L_t C_0 - L_t C_1$$
$$c = 1$$

The anti-resonant frequency fa_off2 (not shown) when the switch SW is OFF is the same as the anti-resonant frequency fa_on when the switch SW is ON, and is expressed by equation 12.

[Math. 12]

$$f_{a\_off2} = \frac{\sqrt{1 + \frac{C_1}{C_0}}}{2\pi\sqrt{L_1 C_1}} \quad \text{(Equation 12)}$$

According to equations 5, 6, 11, and 12, the graph on the right side of FIG. 5B shows that, when the impedance element $X_1$ is an inductor, the anti-resonant frequencies fa_on and fa_off2 (not shown) coincide with each other regardless of whether the switch SW is ON or OFF. The graph on the right side of FIG. 5B also shows that the resonant frequency (fr_off2) when the switch SW is OFF is positioned on the lower-frequency side than the resonant frequency (fr_on) when the switch SW is ON.

[1.4. Electrode Structure of Radio-Frequency Filter 10]

Details of the electrode structure of the radio-frequency filter 10 will now be described below.

[1.4.1 Overall Structure]

Each of FIGS. 6A, 6B, 6C and 6D schematically illustrates the electrode structure of the radio-frequency filter 10 according to the first embodiment. More specifically, FIG. 6A is a plan view of the electrode structure, FIG. 6B is a sectional view taken along line C-C' of FIG. 6A, FIG. 6C is a sectional view taken along line D-D' of FIG. 6A, and FIG. 6D is a sectional view taken along line E-E' of FIG. 6A. The electrode structure shown in FIGS. 6A, 6B, 6C and 6D is illustrated for explaining the typical structure of each resonator forming the radio-frequency filter 10 and interdigital capacitor electrodes forming the capacitors C1 and C2. The numbers and the lengths of electrode fingers forming the IDT electrode of each resonator and those forming the interdigital capacitor electrodes of the radio-frequency filter 10 are not restricted to those shown in FIGS. 6A, 6B, 6C and 6D. The switches SW1 and SW2 are also schematically illustrated in FIGS. 6A and 6B. However, the position and structure of the switches SW1 and SW2 are not particularly restricted. For example, the switches SW1 and SW2 may be formed on a different chip from that on which the resonators and the interdigital capacitor electrodes are formed.

As shown in FIGS. 6A, 6B, 6C and 6D, each of the resonators forming the radio-frequency filter 10 is an acoustic wave resonator using acoustic waves, for example. The radio-frequency filter 10 can thus be formed by using IDT electrodes formed on a piezoelectric substrate 102. This makes it possible to implement a small-size, low-height filter circuit exhibiting bandpass characteristics having the improved sharpness.

The series arm resonator s1 includes an IDT electrode, a pair of reflectors, and the piezoelectric substrate 102. The parallel arm resonator p1 includes an IDT electrode 121 constituted by plural electrode fingers 121a, a pair of reflectors, and the piezoelectric substrate 102.

As shown in FIG. 6A and FIG. 6B, the IDT electrode 121 of the parallel arm resonator p1 is constituted by an electrode film 101, which is formed on the piezoelectric substrate 102.

The IDT electrode 121 is formed as follows. The IDT electrode 121 includes the plural electrode fingers 121a (FIG. 6B) and a pair of busbar electrodes which oppose to each other with the plural electrode fingers 121a therebetween. The plural electrode fingers 121a are alternately connected to one and the other busbar electrodes. The plural electrode fingers 121a are formed along the direction perpendicular to the propagation direction of the acoustic waves and are regularly arranged along the propagation direction.

In the parallel arm resonator p1 configured as described above, the wavelength of acoustic waves to be excited is determined by the design parameters of the IDT electrode 121, for example. The design parameters of the IDT electrode 121 will be discussed below.

The wavelength of acoustic waves is determined by the repeating period $\lambda p1$ of the electrode fingers 121a (FIG. 6B) connected to one busbar electrode among the electrode fingers 121a forming the IDT electrode 121. The electrode finger pitch (the pitch of the plural electrode fingers 121a, that is, the electrode finger period) Pp1, is ½ of the repeating period $\lambda p1$. The electrode finger pitch Pp1 is also defined by Pp1=(Wp1+Sp1) where Wp1 indicates the line width of the electrode fingers 121a and Sp1 indicates the space width between the adjacent electrode fingers 121a. The intersecting width Lp1 of the IDT electrode 121 is the length of the electrode fingers by which the electrode finger 121a connected to one of the pair of busbars and the electrode finger 121a connected to the other busbar overlap with each other as viewed from the propagation direction of the acoustic waves. The electrode duty (duty ratio) is the ratio of the line width of each of the plural electrode fingers 121a, and is defined by the ratio of the line width to the total width of the line width and the space width of the plural electrode fingers 121a, that is, the electrode duty is defined by Wp1/(Wp1+Sp1). In other words, the electrode duty is defined by the ratio of the width of each of the plural electrode fingers 121a to the electrode finger pitch (the pitch of the plural electrode fingers 121a), that is, by Wp1/Pp1. The number of pairs is the number of pairs of electrode fingers 121a, and is roughly half the total number of electrode fingers 121a. For example, Mp1=2Np1+1 is satisfied where Np1 is the number of pairs of electrode fingers 121a and Mp1 is the total number of electrode fingers 121a. The film thickness of the electrode fingers 121a is the thickness Tp1 of the electrode film 101 forming the electrode fingers 121a. The electrostatic capacity $C_0$ of the acoustic wave resonator is expressed by equation 13.

[Math. 13]

Electrostatic capacity $C_0 = \dfrac{\varepsilon_0 \cdot \varepsilon_r \cdot \text{Number of pairs of electrode fingers} \cdot \text{Intersecting width}}{2 \cdot (1 - \text{Electrode duty})}$ (Equation 13)

$\varepsilon_0$ is a dielectric constant in a vacuum, and $\varepsilon_r$ is a dielectric constant of the piezoelectric substrate 102.

The structure of the capacitors C1 and C2 will now be discussed below.

The capacitor C1 includes the piezoelectric substrate 102 and an interdigital capacitor electrode 103 formed on the piezoelectric substrate 102. The interdigital capacitor electrode 103 is a second interdigital capacitor electrode constituted by plural electrode fingers 131a. As shown in FIG. 6A and FIG. 6C, the interdigital capacitor electrode 103 is constituted by the electrode film 101, as in the IDT electrode 121. That is, the interdigital capacitor electrode 103 forming the capacitor C1 is formed on the same piezoelectric substrate 102 as the IDT electrode 121 forming the parallel arm resonator p1. However, the interdigital capacitor electrode 103 and the IDT electrode 121 may alternatively be formed on different piezoelectric substrates.

The interdigital capacitor electrode 103 is formed as follows. The interdigital capacitor electrode 103 includes plural electrode fingers 131a (FIG. 6C) and a pair of busbar electrodes which oppose to each other with the plural electrode fingers 131a therebetween. The plural electrode fingers 131a are alternately connected to one and the other busbar electrodes. The plural electrode fingers 131a are formed in the propagation direction of the acoustic waves and are regularly arranged in the direction perpendicular to the propagation direction.

The capacitor C2 includes the piezoelectric substrate 102 and an interdigital capacitor electrode 104 formed on the piezoelectric substrate 102. The interdigital capacitor electrode 104 is a first interdigital capacitor electrode constituted by plural electrode fingers 141a. As shown in FIG. 6A and FIG. 6D, the interdigital capacitor electrode 104 is constituted by the electrode film 101, as in the IDT electrode 121. That is, the interdigital capacitor electrode 104 forming the capacitor C2 is formed on the same piezoelectric substrate 102 as the IDT electrode 121 forming the parallel arm resonator p1. However, the interdigital capacitor electrode 104 and the IDT electrode 121 may alternatively be formed on different piezoelectric substrates.

The interdigital capacitor electrode 104 is formed as follows. The interdigital capacitor electrode 104 includes plural electrode fingers 141a (FIG. 6D) and a pair of busbar electrodes which oppose to each other with the plural electrode fingers 141a therebetween. The plural electrode fingers 141a are alternately connected to one and the other busbar electrodes. The plural electrode fingers 141a are formed in the propagation direction of the acoustic waves and are regularly arranged in the direction perpendicular to the propagation direction.

In the capacitors C1 and C2 configured as described above, the characteristics, such as the capacitance and the Q factor, are determined by the design parameters of the interdigital capacitor electrodes 103 and 104, for example. The design parameters of the interdigital capacitor electrodes 103 and 104 will be discussed below.

The electrode finger pitch (the pitch of the electrode fingers, that is, the electrode finger period) Pc1 in FIG. 6C (Pc2 in FIG. 6D), of the interdigital capacitor electrode 103 (104) is defined by Pc1=Wc1+Sc1 (Pc2=Wc2+Sc2) where Wc1 (Wc2) is the line width of each of the electrode fingers 131a (141a) and Sc1 (Sc2) is the space width between the adjacent electrode fingers 131a (141a). The electrode duty (duty ratio) is the ratio of the line width of each of the plural electrode fingers 131a (141a), and is defined by the ratio of the line width to the total width of the line width and the space width of the plural electrode fingers 131a (141a), that is, the electrode duty is defined by Wc1/(Wc1+Sc1) (or Wc2/(Wc2+Sc2)). In other words, the electrode duty is defined by the ratio of the width of each of the plural electrode fingers 131a (141a) to the pitch of the plural electrode fingers 131a (141a), that is, by Wc1/Pc1 (Wc2/Pc2). The number of pairs is the number of pairs of electrode fingers 131a (141a), and is roughly half the total number of electrode fingers 131a (141a). For example, Mc1=2Nc1+1 (Mc2=2Nc2+1) is satisfied where Nc1 (Nc2) is the number of pairs of electrode fingers 131a (141a) and Mc1 (Mc2) is the total number of electrode fingers 131a (141a). The film thickness of the electrode fingers 131a (141a) is the thickness Tc1 (Tc2) of the electrode film 101 forming the electrode fingers 131a (141a).

The design parameters of the interdigital capacitor electrode 103 (104) forming the capacitor C1 (C2) and those of the IDT electrode 121 forming the parallel arm resonator p1 connected to the capacitor C1 will be discussed below in comparison with each other.

The electrode finger pitches of the capacitors C1 and C2 are narrower than the electrode finger pitch of the parallel arm resonator p1. That is, Pc1<Pp1 and Pc2<Pp1 are satisfied. The pitch of the plural electrode fingers 131a of the capacitor C1 is preferably 80% or smaller of the pitch of the plural electrode fingers 121a of the parallel arm resonator p1 (that is, Pc1≤0.8×Pp1=0.4λp1). The pitch of the plural electrode fingers 141a of the capacitor C2 is preferably 80% or smaller of the pitch of the plural electrode fingers 121a of the parallel arm resonator p1 (that is, Pc2≤0.8×Pp1=0.4λp1).

The film thickness of the plural electrode fingers 131a of the capacitor C1 is smaller than that of the plural electrode fingers 121a of the parallel arm resonator p1. That is, Tc1<Tp1 is satisfied. Because of the manufacturing reason, the film thickness Tc1 of the electrode fingers 131a is preferably 40% or smaller of the electrode finger pitch Pc1 of the capacitor C1 (that is, Tc1≤0.40×Pc1). The film thickness of the plural electrode fingers 141a of the capacitor C2 is smaller than that of the plural electrode fingers 121a of the parallel arm resonator p1. That is, Tc2<Tp1 is satisfied. Because of the manufacturing reason, the film thickness Tc2 of the electrode fingers 141a is preferably 40% or smaller of the electrode finger pitch Pc2 of the capacitor C2 (that is, Tc2≤0.40×Pc2). For a similar reason, the film thickness Tp1 of the electrode fingers 121a is preferably 40% or smaller of the electrode finger pitch Pp1 of the parallel arm resonator p1 (that is, Tp1≤0.40×Pp1). Although the minimum value of the film thickness Tc1 of the electrode fingers 131a is not particularly restricted, it may be 15% or greater of the electrode finger pitch Pc1 (that is, 0.15×Pc1≤Tc1). Although the minimum value of the film thickness Tc2 of the electrode fingers 141a is not particularly restricted, it may be 15% or greater of the electrode finger pitch Pc2 (that is, 0.15×Pc2≤Tc2). Likewise, although the minimum value of the film thickness Tp1 of the electrode fingers 121a is not particularly restricted, it may be 15% or greater of the electrode finger pitch Pp1 (that is, 0.15×Pp1≤Tp1).

The electrode duty of the capacitor C1 is preferably greater than that of the parallel arm resonator p1. That is, the capacitor C1 and the parallel arm resonator p1 preferably satisfy Wc1/Pc1>Wp1/Pp1. With this configuration, the capacitance per unit area of the interdigital capacitor electrode 103 is increased, thereby making it possible to reduce the size of the radio-frequency filter and also to enhance the space-saving characteristics. The electrode duty of the capacitor C2 is preferably greater than that of the parallel arm resonator p1. That is, the capacitor C2 and the parallel arm resonator p1 preferably satisfy Wc2/Pc2>Wp1/Pp1. With this configuration, the capacitance per unit area of the interdigital capacitor electrode 104 is increased, thereby making it possible to reduce the size of the radio-frequency filter and also to enhance the space-saving characteristics.

In each of the elements (such as series arm resonator s1, parallel arm resonator p1, and capacitors C1 and C2), each of the electrode finger pitch, film thickness, electrode duty is not necessarily uniform due to variations in the manufacturing process or adjustments made to the characteristics, for example. Each of the interdigital capacitor electrode forming the capacitor C1 and the interdigital capacitor electrode forming the capacitor C2 and the IDT electrode forming the parallel arm resonator p1 may not entirely satisfy the above-described relationships regarding the electrode finger pitch, film thickness, and electrode duty. However, it is sufficient if the above-described relationships regarding the electrode finger pitch, film thickness, and electrode duty between each of the capacitors C1 and C2 and the parallel arm resonator p1 are substantially satisfied. For example, it is sufficient if the above-described relationships between the average of each of the electrode finger pitch, film thickness, and electrode duty of the capacitor C1 and that of the parallel arm resonator p1 are satisfied.

[1.4.2 Characteristics of Capacitors C1 and C2]

In the radio-frequency filter 10 according to this embodiment, the electrode finger pitch and the film thickness of the parallel arm resonator p1 and those of the capacitors C1 and C2 satisfy the above-described relationships. It is thus possible to achieve both of the required Q factor of the parallel arm resonator p1 and that of the capacitors C1 and C2.

This is due to the fact that the characteristics of the capacitors C1 and C2 are determined by the design parameters. The reason why the above-described advantage is achieved will be explained below by using the capacitors C1 and C2 in a typical example.

[1.4.3 Relation to Electrode Finger Pitch]

The relation between the electrode finger pitch and the characteristics of the capacitor C1 in a typical example will first be discussed. The design parameters other than the electrode finger pitch are fixed. The electrode duty is 0.60 (that is, Wc1/Pc1=0.60), and the ratio of the film thickness to the electrode finger pitch is 0.20 (that is, Tc1=0.20×Pc1). The electrode finger pitch of the series arm resonator s1 is 2.78 μm.

FIGS. 7A, 7B, 7C and 7D shows graphs illustrating the relationships of the electrode finger pitch of the capacitor C1 to the capacitance and capacitor Q factor of the capacitor C1, the impedance of the parallel arm resonance circuit, and filter characteristics in a typical example. More specifically, FIGS. 7A, 7B, 7C and 7D illustrate the frequency characteristics when the electrode finger pitch Pc1 is varied among 0.75, 1.75, 2.50, and 4.00 (unit is μm).

As shown in FIG. 7A, the capacitance remains almost the same even though the electrode finger pitch Pc1 is varied. In this case, the capacitance is the capacitance (electrostatic capacity) in a low-frequency range where the influences caused by the self-resonance of the interdigital capacitor are almost negligible. The self-resonant frequency of the capacitor C1 shifts to the higher-frequency side as the electrode finger pitch Pc1 is smaller.

As shown in FIG. 7B, although the Q factor (capacitor Q) of the capacitor C1 is roughly progressively decreased as the frequency becomes higher, it is locally decreased at the self-resonant frequency. Accordingly, if the electrode finger pitch Pc1 is set to be small to shift the self-resonant frequency of the interdigital capacitor to the higher-frequency side than the pass band of the radio-frequency filter 10, the Q factor of the interdigital capacitor in the pass band can be increased.

In other words, as the electrode finger pitch Pc1 is wider, the self-resonant frequency of the capacitor C1 shifts to the lower-frequency side. This may cause the self-resonant frequency to coincide with the resonant frequency or the anti-resonant frequency of the parallel arm resonator p1 which is connected to the capacitor C1 without having another acoustic wave resonator interposed therebetween. That is, the resonant frequency or the anti-resonant frequency of the parallel arm resonator p1 may coincide with the frequency at which the capacitor Q is locally decreased. In this case, the Q factor at the resonant frequency or the anti-resonant frequency obtained by the combined characteristics of the parallel arm resonator p1 and the capacitor C1 is decreased due to the locally decreased Q factor of the capacitor C1. This makes it difficult to achieve the required Q factor. Because of the above-described reason, the electrode finger pitch Pc1 is decreased so as to shift the self-resonant frequency of the capacitor C1 to the higher-frequency side than the resonant frequency and the anti-resonant frequency of the parallel arm resonator p1. This makes it less likely to reduce the Q factor of the combined characteristics of the parallel arm resonator p1 and the capacitor C1. As a result, the required Q factor can be obtained.

As the electrode finger pitch Pc1 is smaller, the size of the interdigital capacitor can be reduced while maintaining the capacitance. It is thus possible to reduce the size of the radio-frequency filter 10 including the capacitor C1, for example, and also to enhance the space-saving characteristics.

FIG. 7E is a graph illustrating the relationship between the electrode finger pitch Pc1 of the capacitor C1 and the insertion loss in the pass band in a typical example. The bandpass characteristics shown in FIG. 7E are those when the switches SW1 and SW2 are both OFF. That is, the parallel arm resonance circuit is a series circuit of the parallel arm resonator p1 and the capacitor C1.

As shown in FIGS. 7A, 7B, 7C and 7D, as the electrode finger pitch of the capacitor C1 becomes wider, the self-resonant frequency of the capacitor C1 shifts to the lower-frequency side, thereby decreasing the capacitor Q factor. Accordingly, as shown in FIG. 7E, as the electrode finger pitch of the capacitor C1 becomes closer to that of the parallel arm resonator p1, the capacitor Q factor is decreased, thereby increasing the insertion loss and decreasing the attenuation characteristics at the low and high edges of the pass band (see FIG. 7C and FIG. 7D). It is thus necessary to set the electrode finger pitch of the capacitor C1 to be smaller than that of the parallel arm resonator p1 and also to set the film thickness of the capacitor C1 to be thinner than that of the parallel arm resonator p1.

FIGS. 8A, 8B, 8C and 8D show graphs illustrating the relationships of the electrode finger pitch of the capacitor C2 to the capacitance and capacitor Q factor of the capacitor C2, the impedance of the parallel arm resonance circuit, and filter characteristics in a typical example. More specifically, FIGS. 8A, 8B, 8C and 8D illustrate the frequency characteristics when the electrode finger pitch Pc2 is varied among 0.75, 1.75, 2.50, and 4.00 (unit is μm).

As shown in FIG. 8A, the capacitance remains almost the same even though the electrode finger pitch Pc2 is varied. The self-resonant frequency of the capacitor C2 shifts to the higher-frequency side as the electrode finger pitch Pc2 is smaller.

As shown in FIG. 8B, although the Q factor (capacitor Q) of the capacitor C2 is roughly progressively decreased as the frequency becomes higher, it is locally decreased at the self-resonant frequency. Accordingly, if the electrode finger pitch Pc2 is set to be small to shift the self-resonant frequency of the interdigital capacitor to the higher-frequency side than the pass band of the radio-frequency filter 10, the Q factor of the interdigital capacitor in the pass band can be increased.

In other words, as the electrode finger pitch Pc2 is wider, the self-resonant frequency of the capacitor C2 shifts to the lower-frequency side. This may cause the self-resonant frequency to coincide with the resonant frequency or the anti-resonant frequency of the parallel arm resonator p1 which is connected to the capacitor C2 without having another acoustic wave resonator interposed therebetween. That is, the resonant frequency or the anti-resonant frequency of the parallel arm resonator p1 may coincide with the frequency at which the capacitor Q is locally decreased. In this case, the Q factor at the resonant frequency or the anti-resonant frequency obtained by the combined characteristics of the parallel arm resonator p1 and the capacitor C2 is decreased due to the locally decreased Q factor of the capacitor C2. This makes it difficult to achieve the required Q factor. Because of the above-described reason, the electrode finger pitch Pc2 is decreased so as to shift the self-resonant frequency of the capacitor C2 to the higher-frequency side than the resonant frequency and the anti-resonant frequency of the parallel arm resonator p1. This makes it less likely to reduce the Q factor of the combined characteristics of the parallel arm resonator p1 and the capacitor C2. As a result, the required Q factor can be obtained.

As the electrode finger pitch Pc2 is smaller, the size of the interdigital capacitor can be reduced while maintaining the capacitance. It is thus possible to reduce the size of the radio-frequency filter 10 including the capacitor C2, for example, and also to enhance the space-saving characteristics.

FIG. 8E is a graph illustrating the relationship between the electrode finger pitch Pc2 of the capacitor C2 and the insertion loss in the pass band in a typical example. The bandpass characteristics shown in FIG. 8E are those when the switches SW1 and SW2 are both ON. That is, the parallel arm resonance circuit is a parallel circuit of the parallel arm resonator p1 and the capacitor C2.

As shown in FIGS. 8A, 8B, 8C and 8D, as the electrode finger pitch of the capacitor C2 becomes wider, the self-resonant frequency of the capacitor C2 shifts to the lower-frequency side, thereby decreasing the capacitor Q factor. Accordingly, as shown in FIG. 8E, as the electrode finger pitch of the capacitor C2 becomes closer to that of the parallel arm resonator p1, the capacitor Q factor is decreased, thereby increasing the insertion loss in the pass band. It is thus necessary to set the electrode finger pitch of the capacitor C2 to be smaller than that of the parallel arm resonator p1 and also to set the film thickness of the capacitor C2 to be thinner than that of the parallel arm resonator p1.

[1.5 Characteristics of Switches SW1 and SW2]

The influence of the ON-resistance of the switches SW1 and SW2 in the radio-frequency filter 10 will now be described below.

FIG. 9A shows graphs illustrating the relationship between the filter characteristics and the ON-resistance of the switch SW1 when the switches SW1 and SW2 are OFF in a typical example. The ON-resistance of the switch SW1 is the resistance of the switch SW1 in the ON state. FIG. 9A illustrates variations in the filter characteristics in accordance with a change in the ON-resistance of the switch SW1, in a radio-frequency filter constituted by the series arm resonator s1 and a parallel arm resonance circuit represented by a series circuit of the parallel arm resonator p1 and the switch SW1. FIG. 9A shows that, as the ON-resistance of the switch SW1 becomes higher, the insertion loss, in particular, at the high and low edges of the pass band is increased.

FIG. 9B is a graph illustrating the relationship between the ON-resistance of the switch SW1 and the insertion loss in the pass band in a typical example. More specifically, FIG. 9B illustrates the relationship between the ON-resistance of the switch SW1 and the insertion loss at the low edge (774 MHz), central points (794 and 838 MHz), and high edge (858 MHz) of the pass band. In FIG. 9B, when Ron1 (Ω) denotes the ON-resistance of the switch SW1 and $D_{IL}$ (dB) denotes an increase in the insertion loss, an increase in the insertion loss at the low edge (774 MHz) of the pass band is expressed by $D_{IL}=0.0837 \times Ron1$. An increase in the insertion loss at the central points (794 and 838 MHz) of the pass band is expressed by $D_{IL}=(0.0125$ to $0.0126) \times Ron1$, which is lower than that at the low edge (774 MHz) of the pass band.

FIG. 10A shows graphs illustrating the relationship between the filter characteristics and the ON-resistance of the switch SW2 when the switches SW1 and SW2 are ON in a typical example. FIG. 10A illustrates variations in the filter characteristics in accordance with a change in the ON-resistance of the switch SW2, in a radio-frequency filter constituted by the series arm resonator s1 and a parallel arm resonance circuit including the parallel arm resonator p1, the capacitor C2, and the switch SW2. The parallel arm resonance circuit is a parallel circuit of the parallel arm resonator p1 and a series circuit of the capacitor C2 and the switch SW2. FIG. 10A shows that, as the ON-resistance of the switch SW2 becomes higher, the insertion loss in the pass band is increased.

FIG. 10B is a graph illustrating the relationship between the ON-resistance of the switch SW2 and the insertion loss in the pass band in a typical example. More specifically, FIG. 10B illustrates the relationship between the ON-resistance of the switch SW2 and the insertion loss at the low edge (771 MHz), central points (791 and 837 MHz), and high edge (857 MHz) of the pass band. In FIG. 10B, when Ron2 (Ω) denotes the ON-resistance of the switch SW2 and $D_{IL}$ (dB) denotes an increase in the insertion loss, an increase in the insertion loss at the low edge (771 MHz) of the pass band is expressed by $D_{IL} \cong (0.0125$ to $0.0182) \times Ron2$. This is lower than an increase in the insertion loss at the low edge of the pass band incurred by the ON-resistance Ron1 of the switch SW1 shown in FIG. 9B.

It is thus preferable that the ON-resistance Ron1 of the switch SW1 be lower than the ON-resistance Ron2 of the switch SW2.

As shown in FIGS. 9B and 10B, as the ON-resistance of the switch SW1 and that of the switch SW2 become higher, the insertion loss in the pass band is increased. The degree by which the insertion loss at the low edge of the pass band rises in response to an increase in the ON-resistance of the switch SW1 is higher than that in response to an increase in the ON-resistance of the switch SW2. A large space is required for forming the switches SW1 and SW2 to contain the ON-resistance of the switches SW1 and SW2 to be small. With the above-described configuration, as a result of reducing the ON-resistance Ron1 of the switch SW1, which significantly influences the insertion loss at the low edge of the pass band, to be relatively small in comparison with the ON-resistance Ron2 of the switch SW2, the size of the radio-frequency filter can be reduced while maintaining a small loss at the low edge of the pass band.

[1.6 Configuration of Radio-Frequency Filter 20 According to First Modified Example]

FIG. 11 is a circuit diagram of a radio-frequency filter 20 according to a first modified example of the first embodiment. The radio-frequency filter 20 shown in FIG. 11 includes a series arm resonator s1 and parallel arm circuits 130 and 120. The configuration of the radio-frequency filter 20 according to this modified example is different from that of the radio-frequency filter 10 of the first embodiment only in that it also includes an inductor L1 connected in series with the switch SW1. The radio-frequency filter 20 of the first modified example will be described below mainly by referring to the points different from the radio-frequency filter 10 of the first embodiment while omitting the same points as those of the radio-frequency filter 10.

The parallel arm circuit 130 is a first parallel arm circuit connected to a node x1 and a ground. The parallel arm circuit 120 is a second parallel arm circuit connected to a node x1 and a ground.

The parallel arm circuit 130 includes a parallel arm resonator p1 and a variable frequency circuit 130A connected in series with each other between a node x1 and a ground. The variable frequency circuit 130A changes the resonant frequency of the parallel arm circuit 130.

The variable frequency circuit 130A includes a capacitor C1 (second capacitor and first impedance element) and a first series circuit which are connected in parallel with each other and which are connected to the parallel arm resonator p1. The first series circuit includes the switch SW1 and the inductor L1 (second impedance element) connected in series with each other between the parallel arm resonator p1 and a ground.

[1.7 Impedance Characteristics and Bandpass Characteristics of Radio-Frequency Filter 20]

FIG. 12A shows graphs illustrating the impedance characteristics and the bandpass characteristics of the radio-frequency filter 20 according to the first modified example of the first embodiment. The top section of FIG. 12A shows the resonance characteristics of the series arm resonator s1 and a parallel arm resonance circuit constituted by the parallel arm circuits 130 and 120. Concerning the parallel arm resonance circuit, the resonance characteristics in two states, that is, in a state in which the switches SW1 and SW2 are both ON and in a state in which the switches SW1 and SW2 are both OFF, are shown.

In the circuit configuration shown in FIG. 11, when the switches SW1 and SW2 are OFF, the filter characteristics are equal to those when the switches SW1 and SW2 of the radio-frequency filter 10 shown in FIG. 1A are both OFF. That is, the parallel arm resonance circuit is represented by a series circuit of the parallel arm resonator p1 and the capacitor C1, and the resonant frequency of the parallel arm resonance circuit shifts to the resonant frequency $frp_{off1}$ on the higher-frequency side. The anti-resonant frequency $fap_{off2}$ of the parallel arm resonance circuit remains equal to the anti-resonant frequency fap of the parallel arm resonator p1.

A description will now be given of the operation in the circuit configuration shown in FIG. 11 when the switches SW1 and switch SW2 are both ON.

As illustrated in FIG. 11 and the graph of the top section of FIG. 12A, the parallel arm circuit 130 is represented by a combined circuit in which the parallel circuit of the capacitor C1 and the inductor L1 is connected in series with the parallel arm resonator p1. In this case, when the resonant frequency $(=1/(2\pi\sqrt{(L1 \cdot C1)}))$ of the parallel circuit of the capacitor C1 and the inductor L1 is higher than the resonant frequency frp of the parallel arm resonator p1, the impedance of the parallel circuit becomes inductive. The resonant frequency of the parallel arm resonance circuit shifts to the resonant frequency $frp_{on1}$ positioned on the lower-frequency side than the resonant frequency frp of the parallel arm resonator p1. With this configuration, the frequency difference between the resonant frequency $frp_{off1}$ of the parallel arm resonance circuit when the switch SW1 is OFF and the resonant frequency $frp_{on1}$ of the parallel arm resonance circuit when the switch SW1 is ON becomes greater than that of the radio-frequency filter 10 of the first embodiment. Additionally, the capacitor C2 of the parallel arm circuit 120, which is the second parallel arm circuit, is connected in parallel with the parallel arm circuit 130. The anti-resonant frequency of the parallel arm resonance circuit thus shifts to the anti-resonant frequency $fap_{on2}$ positioned on the lower-frequency side than the anti-resonant frequency fap of the parallel arm resonator p1.

FIG. 12B is a graph illustrating a comparison between the bandpass characteristics of the radio-frequency filter of the first embodiment and those of the first modified example. As shown in FIG. 12B, the radio-frequency filter 20 of this modified example implements a wider variable frequency range of the pass band on the lower-frequency side and that of the attenuation pole on the lower-frequency side of the pass band than the radio-frequency filter 10 of the first embodiment.

That is, in accordance with the ON/OFF switching of the switch SW1, it is possible to switch between the state in which both of the capacitor C1 (first impedance element) and the inductor L1 (second impedance element) are connected to the parallel arm resonator p1 and the state in which only the capacitor C1 (first impedance element) is connected to the parallel arm resonator p1, thereby making it possible to considerably change the impedance added to the parallel arm resonator p1. This significantly changes the resonant frequency of the parallel arm resonance circuit, thereby making it possible to increase the variable frequency range of the pass band on the lower-frequency side and that of the attenuation pole on the lower-frequency side of the pass band.

In the radio-frequency filter 20, the second impedance element connected in series with the switch SW1 is an inductor, while the first impedance element connected in parallel with the series circuit of the switch SW1 and the second impedance element is a capacitor. However, the arrangement of the inductor and the capacitor may be reversed. That is, the second impedance element connected in series with the switch SW1 may be a capacitor, while the first impedance element connected in parallel with the series circuit of the switch SW1 and the second impedance element may be an inductor.

Second Embodiment

In the first embodiment, the impedance element connected to the parallel arm resonator p1 of the radio-frequency filter 10 is a capacitor. In this embodiment, a radio-frequency filter in which the impedance element connected to the parallel arm resonator p1 is an inductor will be discussed.

[2.1 Configuration of Radio-Frequency Filter 30]

FIG. 13A is a circuit diagram of a radio-frequency filter 30 according to a second embodiment. The radio-frequency filter 30 shown in FIG. 13A includes a series arm resonator s1 and parallel arm circuits 150 and 120. The configuration of the radio-frequency filter 30 according to this embodiment is different from that of the radio-frequency filter 10 of the first embodiment only in that the first impedance element forming a variable frequency circuit is an inductor L1 instead of the capacitor C1. The radio-frequency filter 30 according to this embodiment will be described below mainly by referring to the points different from the radio-frequency filter 10 of the first embodiment while omitting the same points as those of the radio-frequency filter 10.

The parallel arm circuit 150 is a first parallel arm circuit connected to a node x1 and a ground. The parallel arm circuit 120 is a second parallel arm circuit connected to a node x1 and a ground.

The parallel arm circuit 150 includes a parallel arm resonator p1 and a variable frequency circuit 150A connected in series with each other between a node x1 and a ground. The variable frequency circuit 150A changes the resonant frequency of the parallel arm circuit 150.

The variable frequency circuit 150A includes the inductor L1 (first impedance element) and a switch SW1 (first switch) connected in parallel with each other and connected to the parallel arm resonator p1.

The parallel arm circuit 120 includes a capacitor C2 (first capacitor) and a switch SW2 (second switch) connected in series with each other between a node x1 and a ground.

In the radio-frequency filter 30, the parallel arm resonator p1 and the variable frequency circuit 150A are connected in series with each other between a node x1 and a ground. The connection order of the parallel arm resonator p1 and the variable frequency circuit 150A is not particularly restricted to that shown in FIG. 13A and may be reversed. It is however desirable that the parallel arm resonator p1 is disposed closer to the node x1 than the inductor L1 is, as shown in FIG. 13A. The addition of the inductor L1 shifts the resonant frequency of the parallel arm resonance circuit including the parallel arm resonator p1 to the lower-frequency side. If the inductor L1 is disposed closer to the node x1, the loss of the radio-frequency filter 30 is increased due to the resistance components of the inductor L1. The reason for this is as follows. The anti-resonant frequency of the parallel arm resonator p1 is positioned in the pass band, and if the inductor L1 is disposed closer to the node x1, an input radio-frequency signal is reflected on the inductor L1 when passing therethrough in the pass band.

In the radio-frequency filter 30 configured as described above, as the switching operation for regulating an increase in the insertion loss at the low edge of the pass band by shifting both of the pass band and the attenuation band to the lower-frequency side, two states, that is, a state in which the switch SW1 is ON and the switch SW2 is OFF and a state in which the switch SW1 is OFF and the switch SW2 is ON, are selected. That is, the switches SW1 and SW2 are operated mutually exclusively. Because of this switching operation, the switches SW1 and SW2 can be integrated into a single SPDT (Single Pole Double Throw) circuit.

FIG. 13B is a circuit diagram of a radio-frequency filter 31 according to a modified example of the second embodiment. The radio-frequency filter 31 shown in FIG. 13B includes a series arm resonator s1, a parallel arm resonator p1, an inductor L1, a capacitor C2, and a switch SW3. The configuration of the radio-frequency filter 31 of this modified example is different from that of the radio-frequency filter 30 of the second embodiment in that the switches SW1 and SW2 are integrated into the single switch SW3.

The switch SW3 is an SPDT switch circuit having first and second selection terminals and one common terminal. The first selection terminal is connected to a node between the parallel arm resonator p1 and the inductor L1. The second selection terminal is connected to the capacitor C2. The common terminal is connected to a ground. With this connection configuration of the terminals, the switch SW3 forms a single switch circuit which mutually exclusively selects a state in which the first selection terminal and the common terminal are electrically connected to each other or a state in which the second selection terminal and the common terminal are electrically connected to each other.

That is, one terminal of each of the switches SW1 and SW2 in the radio-frequency filter 30 is the common terminal of the switch SW3 in the radio-frequency filter 31. The other terminal of the switch SW1 in the radio-frequency filter 30 is the first selection terminal of the switch SW3 in the radio-frequency filter 31, while the other terminal of the switch SW2 in the radio-frequency filter 30 is the second selection terminal of the switch SW3 in the radio-frequency filter 31.

This configuration can reduce the number of the terminals of the switches SW1 and SW2 of the radio-frequency filter 30 so as to form the switches SW1 and SW2 into the single switch SW3, thereby reducing the size of the radio-frequency filter 31.

[2.2 Impedance Characteristics and Bandpass Characteristics of Radio-Frequency Filter 30]

FIG. 13C shows graphs illustrating the impedance characteristics and the bandpass characteristics of the radio-frequency filter 30 according to the second embodiment. The top section of FIG. 13C shows the resonance characteristics (impedance characteristics) of the series arm resonator s1 and the parallel arm resonance circuit, which is a combined circuit of the parallel arm circuits 150 and 120. Concerning the parallel arm resonance circuit, the resonance characteristics in two states, that is, in a state in which the switch SW1 is ON and the switch SW2 is OFF and in a state in which the switch SW1 is OFF and the switch SW2 is ON, are shown.

A description will first be given of the operation in the circuit configuration shown in FIG. 13A when the switch SW1 is ON and the switch SW2 is OFF. In this case, the radio-frequency filter 30 is represented by a basic circuit of a ladder surface acoustic wave filter constituted by the series arm resonator s1 and the parallel arm resonator p1, and is similar to the basic circuit of the radio-frequency filter 10 shown in FIG. 1A.

As illustrated in the graph of the top section of FIG. 13C, the resonance characteristics of the series arm resonator s1 are not influenced by the switching of the switches SW1 and SW2 and exhibit the resonant frequency frs and the anti-resonant frequency fas. Concerning the parallel arm resonance circuit, when the switch SW1 is ON and the switch SW2 is OFF, the impedance characteristics are not influenced by the inductor L1 and the capacitor C2. The resonant frequency $frp_{on1}$ of the parallel arm resonance circuit remains equal to the resonant frequency frp of the parallel arm resonator p1, and the anti-resonant frequency $fap_{off2}$ of the parallel arm resonance circuit remains equal to the anti-resonant frequency fap of the parallel arm resonator p1.

A description will now be given of the operation in the circuit configuration shown in FIG. 13A when the switch SW1 is OFF and the switch SW2 is ON.

As illustrated in the graph of the top section of FIG. 13C, concerning the parallel arm resonance circuit, when the switch SW1 is OFF and the switch SW2 is ON, the parallel arm resonance circuit is represented by a parallel circuit of the capacitor C2 and a series circuit of the parallel arm resonator p1 and the inductor L1. The resonant frequency of the parallel arm resonance circuit shifts to the resonant frequency $frp_{off1}$ on the lower-frequency side, and the resonant frequency of the parallel arm resonance circuit also shifts to the anti-resonant frequency $fap_{on2}$ on the lower-frequency side.

To explain the advantages of the radio-frequency filter 30 according to this embodiment, the circuit configuration and filter characteristics of a radio-frequency filter according to a second comparative example, which is a known radio-frequency filter, will be discussed below by way of example.

FIG. 14A is a circuit diagram of a radio-frequency filter 600 according to the second comparative example. The radio-frequency filter 600 shown in FIG. 14A includes a series arm resonator s1 and a parallel arm circuit 610. The radio-frequency filter 600 shown in FIG. 14A is different from the radio-frequency filter 30 of the second embodiment only in that it does not include a second parallel arm circuit constituted by a series circuit of the capacitor C2 and the switch SW2. The radio-frequency filter 600 according to the second comparative example will be described below mainly by referring to the points different from the radio-frequency filter 30 of the second embodiment while omitting the same points as those of the radio-frequency filter 30.

FIG. 14B shows graphs illustrating the impedance characteristics and the bandpass characteristics of the radio-frequency filter 600 according to the second comparative example.

A description will first be given of the operation in the circuit configuration shown in FIG. 14A when the switch SW1 is ON.

As illustrated in the graph of the top section of FIG. 14B, the resonance characteristics of the series arm resonator s1 are not influenced by the switching of the switch SW1 and exhibit the resonant frequency frs and the anti-resonant frequency fas. Concerning the parallel arm resonance circuit, when the switch SW1 is ON, the impedance characteristics are not influenced by the inductor L1 and the resonant frequency $frp_{on}$ of the parallel arm resonance circuit remains equal to the resonant frequency frp of the parallel arm resonator p1. The anti-resonant frequency $fap_{on}$ of the parallel arm resonance circuit remains equal to the anti-resonant frequency fap of the parallel arm resonator p1. When the switch SW1 is OFF, the parallel arm resonance circuit is represented by a series circuit of the parallel arm resonator p1 and the inductor L1. The resonant frequency of the parallel arm resonance circuit shifts to the resonant frequency $frp_{off}$ on the lower-frequency side. The anti-resonant frequency $fap_{off}$ of the parallel arm resonance circuit remains equal to the anti-resonant frequency fap of the parallel arm resonator p1.

That is, the radio-frequency filter 600 forms a variable frequency filter in which the attenuation pole on the lower-frequency side of the pass band shifts to the higher-frequency side when the switch SW1 is ON and shifts to the lower-frequency side when the switch SW1 is OFF. The attenuation pole on the higher-frequency side of the pass band does not change regardless of whether the switch SW1 is ON or OFF.

As described above, in the radio-frequency filter 600 according to the second comparative example, when the switch SW1 is switched from ON to OFF, only the resonant frequency shifts to the lower-frequency side and the anti-resonant frequency remains the same in the parallel arm circuit 610, as shown in the graph of the top section of FIG. 14B.

As shown in the graphs in the middle and bottom sections of FIG. 14B, the bandpass characteristics when the switch SW1 is OFF indicate that the attenuation pole on the lower-frequency side of the pass band shifts farther to the lower-frequency side compared with the bandpass characteristics when the switch SW1 is ON. In this case, the sharpness of the attenuation slope on the lower-frequency side of the pass band is changed. In other words, in regard to the bandpass characteristics, the sharpness on the lower-frequency side of the pass band when the switch SW1 is OFF is less sharp than that when the switch SW1 is ON. This increases the insertion loss at the low edge of the pass band.

FIG. 14B shows an example in which the radio-frequency filter 600 is applied to a variable frequency filter that switches the frequency band between LTE Band 29Rx (717 to 727 MHz) and Band (12+13+14)Rx (729 to 768 MHz). When the switch SW1 is ON (when Band (12+13+14)Rx is selected), the insertion loss at the low edge of the pass band (729 MHz) is 0.393 dB, while the insertion loss at the high edge of the pass band (768 MHz) is 0.170 dB. The insertion loss in the pass band is maintained in a well-balanced manner. When the switch SW1 is OFF (when Band 29Rx is selected), while the insertion loss at the high edge of the pass band (727 MHz) is 0.519 dB, the insertion loss at the low edge of the pass band (717 MHz) is as high as 1.288 dB (the highest insertion loss in the pass band is 1.288 dB).

Having focused on the increased insertion loss at an edge of the pass band as a result of shifting only the attenuation pole, the present inventor has conceived that shifting of the attenuation slope as well as the attenuation pole may be able to regulate an increase in the insertion loss at the edge of the pass band.

A description will return back to the radio-frequency filter 30 according to this embodiment.

In the radio-frequency filter 30 according to this embodiment, as shown in the graph of the top section of FIG. 13C, when the switch SW1 is OFF and the switch SW2 is ON, the resonant frequency of the parallel arm resonance circuit shifts to the resonant frequency $frp_{off1}$ on the lower-frequency side, and also, the anti-resonant frequency of the parallel arm resonance circuit shifts to the anti-resonant frequency $fap_{on2}$ on the lower-frequency side. That is, when the switch SW1 is OFF and the switch SW2 is ON, if the attenuation pole on the lower-frequency side of the pass band is positioned on the lower-frequency side, the insertion loss at the low edge of the pass band is less likely to increase, as represented by the bandpass characteristics in the middle and bottom sections of FIG. 13C.

FIG. 15 shows graphs illustrating a comparison between the bandpass characteristics of the radio-frequency filter of the second embodiment and those of the second comparative example.

FIG. 13C shows an example in which the radio-frequency filter 30 is applied to a variable frequency filter that switches the frequency band between LTE Band 29Rx (717 to 727 MHz) and Band (12+13+14)Rx (729 to 768 MHz). When the switch SW1 is ON (when Band (12+13+14)Rx is selected), the insertion loss at the low edge of the pass band (729 MHz) is 0.393 dB, while the insertion loss at the high edge of the pass band (768 MHz) is 0.170 dB. The insertion loss in the pass band is maintained in a well-balanced manner. When the switch SW1 is OFF (when Band 29Rx is selected), while the insertion loss at the high edge of the pass band (727 MHz) is 0.338 dB, the insertion loss at the low edge of the pass band (717 MHz) is 0.545 dB. The insertion loss in the pass band is also maintained in a well-balanced manner (the highest insertion loss in the pass band is 0.545 dB).

The radio-frequency filter 30 according to this embodiment forms a tunable filter which is constituted by a series arm circuit (series arm resonator s1) and a parallel arm resonance circuit (the combined circuit of parallel arm circuits 150 and 120) and changes the frequency band as a result of switching the switches SW1 and SW2 between ON and OFF. The resonant frequency of the series arm circuit and the anti-resonant frequency of the parallel arm resonance circuit determine the pass band. The resonant frequency of the parallel arm resonance circuit determines the attenuation pole on the lower-frequency side of the pass band, and the anti-resonant frequency of the series arm circuit determines the attenuation pole on the higher-frequency side of the pass band.

When the switch SW1 is ON, the parallel arm circuit 110 is not influenced by the inductor L1 and is represented by a series circuit of the parallel arm resonator p1 and the capacitor C1. When the switch SW1 is OFF, the parallel arm circuit 110 is influenced by the inductor L1 and is represented by a series circuit of the parallel arm resonator p1 and a parallel circuit of the inductor L1 and the capacitor C1, and the resonant frequency of the parallel arm circuit 110 shifts from the resonant frequency $frp_{on1}$ to the resonant frequency $frp_{off1}$. Hence, the frequency of the attenuation pole on the lower-frequency side of the pass band is changed.

When the switch SW2 is OFF, the capacitor C2 does not function, and the parallel arm resonance circuit exhibits the characteristics of only the parallel arm circuit 150. When the switch SW2 is ON, the capacitor C2 functions, and the anti-resonant frequency of the parallel arm resonance circuit shifts to the lower-frequency side (shifts from the anti-resonant frequency $fap_{off2}$ to the anti-resonant frequency $fap_{on2}$).

That is, the frequency of the attenuation pole determined by the resonant frequency of the parallel arm resonance circuit can be changed by using the switch SW1, and also, the frequency of the pass band determined by the anti-resonant frequency of the parallel arm resonance circuit can be changed by using the switch SW2. As a result of the switch SW2 being switched between ON and OFF, the frequency of the pass band becomes variable. When the frequency of the pass band is shifted to the lower-frequency side, it is also possible to change each of the pass band and the attenuation band substantially without increasing the insertion loss at the low edge of the pass band.

Third Embodiment

In this embodiment, a variable-frequency radio-frequency filter including plural second parallel arm circuits will be discussed below.

[3.1 Configuration of Radio-Frequency Filter 40]

FIG. 16 is a circuit diagram of a radio-frequency filter 40 according to a third embodiment. The radio-frequency filter 40 shown in FIG. 16 includes a series arm resonator s1 and parallel arm circuits 120a, 120b, 120c, and 150. The configuration of the radio-frequency filter 40 according to this embodiment is different from that of the radio-frequency filter 30 of the second embodiment in that plural second parallel arm circuits (parallel arm circuits 120a, 120b, and 120c) are connected to the same node x1. The radio-frequency filter 40 according to this embodiment will be described below mainly by referring to the points different from the radio-frequency filter 30 of the second embodiment while omitting the same points as those of the radio-frequency filter 30.

The parallel arm circuit 150 is a first parallel arm circuit connected to a node x1 and a ground. Each of the parallel arm circuits 120a, 120b, and 120c is a second parallel arm circuit connected to a node x1 and a ground.

The parallel arm circuit 150 includes a parallel arm resonator p1 and a variable frequency circuit 150A connected in series with each other between a node x1 and a ground. The variable frequency circuit 150A changes the resonant frequency of the parallel arm circuit 150.

The variable frequency circuit 150A includes an inductor L1 (first impedance element) and a switch SW1 (first switch) connected in parallel with each other and connected to the parallel arm resonator p1.

The parallel arm circuits 120a, 120b, and 120c each include a first capacitor and a second switch connected in series with each other between a node x1 and a ground. More specifically, the parallel arm circuit 120a includes a capacitor C2a and a switch SW2a connected in series with each other. The parallel arm circuit 120b includes a capacitor C2b and a switch SW2b connected in series with each other. The parallel arm circuit 120c includes a capacitor C2c and a switch SW2c connected in series with each other.

In this embodiment, as the second parallel arm circuits, the parallel arm circuits 120a, 120b, and 120c connected in parallel with each other are illustrated by way of example. However, the number of second parallel arm circuits is not restricted to three and is suitably determined in accordance with the precision in varying the pass band in the radio-frequency filter.

As the first parallel arm circuit, the parallel arm circuit 150 provided in the radio-frequency filter 30 according to the second embodiment is illustrated by way of example. However, the first parallel arm circuit may be the parallel arm circuit 110 provided in the radio-frequency filter 10 according to the first embodiment or the parallel arm circuit 130 provided in the radio-frequency filter 20 according to the modified example of the first embodiment.

[3.2 Impedance Characteristics and Bandpass Characteristics of Radio-Frequency Filter 40]

FIG. 17A shows graphs illustrating the filter characteristics when all the second switches of the radio-frequency filter 40 of the third embodiment are OFF. FIG. 17B shows graphs illustrating variations in the filter bandpass characteristics when the switches of the radio-frequency filter 40 of the third embodiment are changed between ON and OFF.

FIG. 17A illustrates the bandpass characteristics of the radio-frequency filter 40 when the switch SW1 is ON and the switches SW2a, SW2b, and SW2c are OFF. That is, in this case, the bandpass characteristics of a basic circuit of a ladder filter constituted by the series arm resonator s1 and the parallel arm resonator p1 are illustrated.

FIG. 17B illustrates the bandpass characteristics of the radio-frequency filter 40 when the switch SW1 is OFF and the switches SW2a, SW2b, and SW2c are variously turned ON and OFF. In contrast to the bandpass characteristics shown in FIG. 17A when the switch SW1 is ON, the bandpass characteristics shown in FIG. 17B when the switch SW1 is OFF indicate that the attenuation pole on the lower-frequency side of the pass band shifts farther to the lower-frequency side due to the influence of the inductor L1. The bandpass characteristics shown in FIG. 17B indicate that, even when the switches SW2a, SW2b, and SW2c are variously turned ON and OFF, the attenuation pole on the lower-frequency side of the pass band remains the same. In contrast, the anti-resonant frequency of the parallel arm resonance circuit is changed as a result of the switches SW2a, SW2b, and SW2c being variously turned ON and OFF. In FIG. 17B, variations in the pass band when the capacitance of the capacitor C2a is 0.5 pF, the capacitance of the capacitor C2b is 1.0 pF, and the capacitance of the capacitor C2c is 2.0 pF are shown.

With this configuration, as a result of individually switching the switches of the parallel-connected plural second parallel arm circuits between ON and OFF, the combined capacitance of the parallel-connected first capacitors of the parallel arm resonance circuit can be changed as desired. This can vary the cutoff frequency (pass band width) of the radio-frequency filter 40 in smaller increments. It is thus possible to select the filter characteristics which incur the smallest loss in accordance with the individual channel to be used.

The capacitance of each of the capacitors C2a, C2b, and C2c is not limited to the above-described value, and may be selected suitably according to the required specifications. For example, the same capacitance may be used for the capacitors C2a, C2b, and C2c.

Fourth Embodiment

In this embodiment, a multiplexer (duplexer) using one of the radio-frequency filters according to the first through third embodiments as a transmit filter or a receive filter will be described below.

FIG. 18 is a circuit diagram of a multiplexer (duplexer) 200 according to a fourth embodiment. The multiplexer 200 shown in FIG. 18 includes a transmit filter 60, a receive filter 50, and a matching inductor 70. The transmit filter 60 is connected to an input terminal 200T and a common terminal 200c. The receive filter 50 is connected to the common terminal 200c and an output terminal 200R.

The transmit filter 60 is a band pass filter using a transmit band as the pass band. The transmit filter 60 is not restricted to a particular circuit configuration.

The circuit configuration of the receive filter 50 is that of the radio-frequency filter according to one of the first through third embodiments. The receive filter 50 is a variable-frequency band pass filter using multiple bands as pass bands. More specifically, the receive filter 50 is a ladder filter circuit including plural series arm resonators and parallel arm resonance circuits 210, 220, and 230. The parallel arm resonance circuits 210, 220, and 230 are each connected between a ground and a node on a path connecting the common terminal 200c and the output terminal 200R.

Each of the parallel arm resonance circuits 210, 220, and 230 includes the first and second parallel arm circuits. The first parallel arm circuit is connected to a ground and a corresponding node on the path connecting the common terminal 200c and the output terminal 200R. The second parallel arm circuit is connected to this node and a ground. The first parallel arm circuit includes a parallel arm resonator and a variable frequency circuit connected in series with each other between the node and a ground. The variable frequency circuit changes the resonant frequency of the first parallel arm circuit. The variable frequency circuit is connected to the parallel arm resonator and includes a first impedance element and a first switch connected in parallel with each other. The second parallel arm circuit includes a first capacitor and a second switch connected in series with each other between the node and a ground.

With the above-described configuration, in a tunable duplexer applied to a system for suitably selecting multiple frequency bands, as a result of switching the first and second switches of the parallel arm circuits, the pass band of each of the parallel arm resonance circuits can be shifted to the lower-frequency side while maintaining the sharpness of the attenuation slope on the lower-frequency side of the pass band, which is determined by the resonant frequency and the anti-resonant frequency of the corresponding parallel arm resonance circuit. It is thus possible to change the pass band substantially without increasing the insertion loss at the low edge of the pass band. Additionally, one filter circuit having switches can handle multiple frequency bands without providing filters for individual frequency bands, thereby reducing the size of the multiplexer.

Fifth Embodiment

The radio-frequency filters discussed in the first through third embodiments and the multiplexer discussed in the fourth embodiment may be applicable to a radio-frequency front-end circuit that supports a system using many bands. Such a radio-frequency front-end circuit and a communication apparatus will be described below in this embodiment.

FIG. 19 is a schematic diagram of a communication apparatus 300 according to a fifth embodiment. In FIG. 19, an antenna element (ANT) and the communication apparatus 300 are shown.

As shown in FIG. 19, the communication apparatus 300 includes a switch group 310 constituted by multiple switches, a filter group 320 constituted by multiple filters, transmit switches 331 and 332, receive switches 351, 352, and 353, transmit amplifier circuits 341 and 342, receive amplifier circuits 361 and 362, an RF signal processing circuit (RFIC), a baseband signal processing circuit (BBIC), and the antenna element (ANT). The antenna element (ANT) may not necessarily be included in the communication apparatus 300.

The switch group 310 connects the antenna element ANT and a signal path corresponding to the predetermined band in accordance with a control signal outputted from a controller (not shown). The switch group 310 is constituted by plural SPST switches. The switch group 310 may not necessarily connect the antenna element ANT to only one signal path and may connect it to multiple signal paths. That is, the communication apparatus 300 may support carrier aggregation.

The filter group 320 is constituted by multiple filters (including duplexers) having pass bands in: (i) the transmit band of Band 12; (ii) the transmit band of Band 13; (iii) the transmit band of Band 14; (iv) the transmit band of Band 27; (v) the transmit band of Band 26; (vi) the receive bands of Band 29 and Band 14 (or Band 12, Band 67, and Band 13); (vii-Tx) the transmit band of Band 68 (or Band 28a or Band 28b); (vii-Rx) the receive band of Band 68 (or Band 28a or Band 28b); (viii-Tx) the transmit band of Band 20; (viii-Rx)

the receive band of Band 20; (ix-Tx) the transmit band of Band 27 (or Band 26); (x-Tx) the transmit band of Band 8; and (x-Rx) the receive band of Band 8.

The transmit switch 331 is a switch circuit including plural selection terminals connected to plural low-band transmit signal paths and a common terminal connected to the transmit amplifier circuit 341. The transmit switch 332 is a switch circuit including plural selection terminals connected to plural high-band transmit signal paths and a common terminal connected to the transmit amplifier circuit 342. The transmit switches 331 and 332 are switch circuits that are disposed at a stage preceding the filter group 320 (at a stage preceding the filter group 320 in the transmit signal paths, in this case) and that are connected or disconnected in accordance with a control signal from the controller (not shown). Radio-frequency signals (radio-frequency transmit signals in this case) amplified by the transmit amplifier circuits 341 and 342 are outputted to the antenna element (ANT) via the predetermined filters of the filter group 320.

The receive switch 351 is a switch circuit including plural selection terminals connected to plural low-band receive signal paths and a common terminal connected to the receive amplifier circuit 361. The receive switch 352 is a switch circuit including a common terminal connected to the receive signal path of the predetermined band (Band 20 in this case) and two selection terminals connected to the selection terminal of the receive switch 351 and that of the receive switch 353. The receive switch 353 is a switch circuit including plural selection terminals connected to plural high-band receive signal paths and a common terminal connected to the receive amplifier circuit 362. The receive switches 351 through 353 are disposed at a stage following the filter group 320 (at a stage following the filter group 320 in the receive signal paths, in this case) and are connected or disconnected in accordance with a control signal from the controller (not shown). Radio-frequency signals (radio-frequency received signals in this case) inputted into the antenna element ANT pass through the predetermined filters of the filter group 320, and are amplified in the receive amplifier circuits 361 and 362, and are then outputted to the RF signal processing circuit (RFIC). An RF signal processing circuit (RFIC) corresponding to low bands and an RF signal processing circuit (RFIC) corresponding to high bands may be individually be provided.

The transmit amplifier circuit 341 is a power amplifier which amplifies the power of a low-band radio-frequency transmit signal. The transmit amplifier circuit 342 is a power amplifier which amplifies the power of a high-band radio-frequency transmit signal.

The receive amplifier circuit 361 is a low-noise amplifier which amplifies the power of a low-band radio-frequency received signal. The receive amplifier circuit 362 is a low-noise amplifier which amplifies the power of a high-band radio-frequency received signal.

The RF signal processing circuit (RFIC) is a circuit which processes radio-frequency signals received by the antenna element (ANT) and those to be sent from the antenna element (ANT). More specifically, the RF signal processing circuit (RFIC) performs signal processing, such as down-conversion, on a radio-frequency signal (radio-frequency received signal in this case) inputted from the antenna element (ANT) via a receive signal path. The RF signal processing circuit (RFIC) then outputs the received signal generated by performing the signal processing to the baseband signal processing circuit (BBIC). The RF signal processing circuit (RFIC) also performs the signal processing, such as up-conversion, on a transmit signal inputted from the baseband signal processing circuit (BBIC). The RF signal processing circuit (RFIC) then outputs a radio-frequency signal (radio-frequency transmit signal in this case) generated by performing the signal processing to a transmit signal path.

The communication apparatus 300 configured as described above includes the radio-frequency filter according to any of the first through third embodiments as at least one of the filter using (vi) the receive bands of Band 29 and Band (or Band 12, Band 67, and Band 13) as the pass bands, the filter using (vii-Tx) the transmit band of Band 68 (or Band 28a and Band 28b) as the pass band, the filter using (vii-Rx) the receive band of Band 68 (or Band 28a and Band 28b) as the pass band, and the filter using (ix-Tx) the transmit band of Band 27 (or Band 26) as the pass band. That is, this filter switches the pass band in accordance with a control signal.

Among the elements of the communication apparatus 300, the switch group 310, the filter group 320, the transmit switches 331 and 332, the receive switches 351, 352, and 353, the transmit amplifier circuits 341 and 342, the receive amplifier circuits 361 and 362, and the above-described controller form a radio-frequency front-end circuit.

The controller may be included in the RF signal processing circuit (RFIC), or may form a switch IC together with the switches controlled by the controller, though such a configuration is not shown in FIG. 19.

The radio-frequency front-end circuit and the communication apparatus 300 each include any of the radio-frequency filters 10, 20, 30, 31, and 40 according to the first through third embodiments. It is thus possible to provide a radio-frequency front-end circuit and a communication apparatus that can switch the pass band in accordance with the required frequency specifications substantially without increasing the insertion loss at the low edge of the pass band. Additionally, the radio-frequency front-end circuit and the communication apparatus require fewer filters than the configuration in which filters are individually provided for the respective bands. The sizes of the radio-frequency front-end circuit and the communication apparatus can accordingly be reduced.

The radio-frequency front-end circuit according to this embodiment includes the transmit switches 331 and 332 (switch circuits) disposed at a stage preceding the filter group 320 (plural radio-frequency filter circuits) and the receive switches 351 through 353 (switch circuits) disposed at a stage following the filter group 320. With this configuration, it is possible to handle together some of the signal paths through which radio-frequency signals are transferred. Hence, the same transmit amplifier circuit 341 (amplifier circuit) can be used for some of the radio-frequency filter circuits, and the same transmit amplifier circuit 342 (amplifier circuit) can be used for some of the radio-frequency filter circuits. Similarly, the same receive amplifier circuit 361 (amplifier circuit) can be used for some of the radio-frequency filter circuits, and the same receive amplifier circuit 362 (amplifier circuit) can be used for some of the radio-frequency filter circuits. As a result, the size and the cost of the radio-frequency front-end circuit can be reduced.

Although the transmit switches 331 and 332 and the receive switches 351 through 353 are provided, at least one of the transmit switches 331 and 332 and at least one of the receive switches 351 through 353 may be provided. The number of transmit switches 331 and 332 and that of the receive switches 351 through 353 are not limited to those discussed in this embodiment. For example, one transmit switch and one receive switch may be provided. The number of the terminals such as the selection terminals of the transmit switches and those of the receive switches are not restricted to those discussed in this embodiment. The transmit switches and receive switches may each have two selection terminals.

Other Embodiments

The radio-frequency filter, the radio-frequency front-end circuit, and the communication apparatus according to embodiments of the present disclosure have been discussed above through illustration of the first through fifth embodiments and modified examples. However, the radio-frequency filter, the radio-frequency front-end circuit, and the communication apparatus according to the present disclosure are not restricted to the above-described embodiments and modified examples. Other embodiments implemented by combining certain elements in the above-described embodiments and modified examples, and modified examples obtained by making various modifications to the above-described embodiments by those skilled in the art without departing from the scope and spirit of the disclosure are also encompassed in the disclosure. Various devices integrating some of the radio-frequency filter, the radio-frequency front-end circuit, and the communication apparatus according to the present disclosure are also encompassed in the disclosure.

A description has been given above, assuming that the radio-frequency filters according to the first through fifth embodiments and modified examples are applied to a system that mutually exclusively switches adjacent frequency bands. However, the radio-frequency filters according to the first through fifth embodiments and modified examples may also be applicable to a system that mutually exclusively switches adjacent multiple channels allocated to one frequency band.

In the radio-frequency filters according to the first through fifth embodiments and modified examples, the piezoelectric substrate 102 forming the acoustic wave filter may be a multilayer structure constituted by a high acoustic velocity support substrate, a low acoustic velocity film, and a piezoelectric film stacked on each other in this order. The piezoelectric film is made of a 50°-Y-cut X-propagating $LiTaO_3$ piezoelectric single crystal (assuming that the x axis is the central axis, a lithium tantalite single crystal is cut in cross section normal to the axis rotated by 50° from the y axis, and acoustic waves propagate through this single crystal in the x-axis direction) or piezoelectric ceramics through which acoustic waves propagate in the x-axis direction, for example. The thickness of the piezoelectric film is 3.5× or smaller, where X denotes the wavelength determined by the electrode finger pitch of the IDT electrode. The high acoustic velocity support substrate is a substrate supporting the low acoustic velocity film, the piezoelectric film, and the electrode film 101. The high acoustic velocity support substrate is a substrate through which bulk waves propagate at a higher speed than acoustic waves, such as surface acoustic waves and boundary acoustic waves, propagating through the piezoelectric film. The high acoustic velocity support substrate serves to trap acoustic waves within the area where the piezoelectric film and the low acoustic velocity film are stacked on each other so as to prevent acoustic waves from leaking downward from the high acoustic velocity support substrate. The high acoustic velocity support substrate is a silicon substrate, for example, and has a thickness of 120 µm, for example. The low acoustic velocity film is a film through which bulk waves propagate at a lower speed than acoustic waves propagating through the piezoelectric film. The low acoustic velocity film is disposed between the piezoelectric film and the high acoustic velocity support substrate. Because of this structure and the properties that acoustic wave energy inherently concentrates on a transmission medium having a low acoustic velocity, a leakage of acoustic wave energy to the outside of the IDT electrode is reduced. The low acoustic velocity film is a film made of silicon dioxide as a main constituent, for example, and has a thickness of 670 nm, for example. This multilayer structure makes it possible to significantly increase the Q factor at the resonant frequency and at the anti-resonant frequency to be higher than the structure in which the piezoelectric substrate 102 has a single layer. That is, this multilayer structure can form surface acoustic wave resonators having a high Q factor. Using such acoustic wave resonators makes it possible to form a filter having a small insertion loss.

The high acoustic velocity support substrate may have a multilayer structure of a support substrate and a high acoustic velocity film through which bulk waves propagate at a higher speed than acoustic waves, such as surface acoustic waves and boundary acoustic waves, propagating through the piezoelectric film. In this case, as the support substrate, a piezoelectric substrate made of a substance, such as sapphire, lithium tantalite, lithium niobate, and crystal; a ceramic substrate made of a substance, such as alumina, magnesia, silicon nitride, aluminum nitride, silicon carbide, zirconia, cordierite, mullite, steatite, and forsterite; a dielectric substrate made of glass, for example; a semiconductor substrate made of a substance, such as silicon and gallium nitride; and a resin substrate may be used. As the high acoustic velocity film, various high acoustic velocity materials, such as aluminum nitride, aluminum oxide, silicon carbide, silicon nitride, silicon oxynitride, a DLC film or diamond, a medium made of any of the above-described materials as a main constituent, and a medium made of a mixture of the above-described materials as a main constituent may be used.

In the radio-frequency filters, the radio-frequency front-end circuit, and the communication apparatus according to the first through fifth embodiments and modified examples, an inductance element and a capacitance element may be connected between the common terminal and each of the input terminal and the output terminal. The radio-frequency filters, the radio-frequency front-end circuit, and the communication apparatus may also include inductance components of wiring for connecting the circuit elements.

The present disclosure finds widespread application in communication devices, such as cellular phones, as a small-size radio-frequency filter, radio-frequency front-end circuit, and communication apparatus which can be used in a multiband and multimode system simultaneously or mutually exclusively using adjacent multiple bands.

10, 20, 30, 31, 40, 500, 600 radio-frequency filter
11*m*, 11*n* input/output terminal
50 receive filter
60 transmit filter
70 matching inductor
101 electrode film
102 piezoelectric substrate
103, 104 interdigital capacitor electrode
110, 120, 120*a*, 120*b*, 120*c*, 130, 150, 160, 210, 220, 230, 510, 610 parallel arm circuit
110A, 130A, 150A variable frequency circuit
121 IDT electrode
121*a*, 131*a*, 141*a* electrode finger
200 multiplexer (duplexer)

200c common terminal
200R output terminal
200T input terminal
300 communication apparatus
310 switch group
320 filter group
331, 332 transmit switch
341, 342 transmit amplifier circuit
351, 352, 353 receive switch
361, 362 receive amplifier circuit
p1 parallel arm resonator
s1 series arm resonator
SW1, SW2 switch

What is claimed is:

1. A radio-frequency filter comprising:
a series arm circuit connected in a path between first and second input/output terminals;
a first parallel arm circuit connected between ground and a node on the path; and
a second parallel arm circuit connected between the node and ground, wherein:
the first parallel arm circuit comprises a parallel arm resonator and a variable frequency circuit connected in series between the node and ground, the variable frequency circuit being configured to change a resonant frequency of the first parallel arm circuit,
the variable frequency circuit comprises a first impedance element and a first switch connected in parallel,
the second parallel arm circuit comprises a first capacitor and a second switch connected in series between the node and ground, and
the first parallel arm circuit and the second parallel arm circuit are in parallel with each other.

2. The radio-frequency filter according to claim 1, wherein:
the first impedance element is a second capacitor,
when the first switch is in a conductive state, the second switch is in a conductive state, and
when the first switch is in a non-conductive state, the second switch is in a non-conductive state.

3. The radio-frequency filter according to claim 2, wherein:
the parallel arm resonator comprises an interdigital transducer (IDT) electrode on a substrate, the IDT electrode at least partly exhibiting piezoelectricity characteristics and having a plurality of electrode fingers;
the second capacitor is constituted by the substrate and a second interdigital capacitor electrode, the second interdigital capacitor electrode being formed on the substrate and having a plurality of electrode fingers;
a pitch of the plurality of electrode fingers of the second interdigital capacitor electrode is less than a pitch of the plurality of electrode fingers of the parallel arm resonator; and
a self-resonant frequency of the second capacitor is greater than an upper frequency of a pass band of the radio-frequency filter.

4. The radio-frequency filter according to claim 3, wherein a film thickness of the plurality of electrode fingers of the second interdigital capacitor electrode is less than or equal to a film thickness of the plurality of electrode fingers of the parallel arm resonator.

5. The radio-frequency filter according to claim 1, wherein:
the parallel arm resonator comprises an interdigital transducer (IDT) electrode on a substrate, the IDT electrode at least partly exhibiting piezoelectricity characteristics and having a plurality of electrode fingers;
the first capacitor is constituted by the substrate and a first interdigital capacitor electrode on the substrate, the first interdigital capacitor electrode being constituted by a plurality of electrode fingers;
a pitch of the plurality of electrode fingers of the first interdigital capacitor electrode is less than a pitch of the plurality of electrode fingers of the parallel arm resonator; and
a self-resonant frequency of the first capacitor is greater than an upper frequency of a pass band of the radio-frequency filter.

6. The radio-frequency filter according to claim 5, wherein a film thickness of the plurality of electrode fingers of the first interdigital capacitor electrode is less than or equal to a film thickness of the plurality of electrode fingers of the parallel arm resonator.

7. The radio-frequency filter according to claim 1, wherein:
the first impedance element is an inductor;
when the first switch is in a conductive state, the second switch is in a non-conductive state; and
when the first switch is in a non-conductive state, the second switch is in a conductive state.

8. The radio-frequency filter according to claim 7, wherein:
the first and second switches constitute a switch circuit comprising first and second selection terminals and a common terminal;
the switch circuit is configured to mutually exclusively select a state in which the first selection terminal and the common terminal are electrically connected to each other or a state in which the second selection terminal and the common terminal are electrically connected to each other;
a first end of each of the first and second switches is connected to the common terminal;
a second end of the first switch is connected to the first selection terminal; and
a second end of the second switch is connected to the second selection terminal.

9. The radio-frequency filter according claim 1, wherein:
the variable frequency circuit further comprises a second impedance element connected in series with the first switch;
the first switch and the second impedance element are connected in parallel with the first impedance element;
the first impedance element is a capacitor or an inductor; and
the second impedance element is the other of the capacitor or the inductor.

10. The radio-frequency filter according to claim 1, wherein a resistance of the second switch when in a conductive state is greater than a resistance of the first switch when in a conductive state.

11. The radio-frequency filter according to claim 1, comprising a plurality of the second parallel arm circuits connected in parallel with each other between the node and ground.

12. The radio-frequency filter according to claim 1, wherein the parallel arm resonator is a surface acoustic wave filter or an acoustic wave filter using bulk acoustic wave (BAW).

13. The radio-frequency filter according to claim 1, wherein the first and second switches are field-effect transistor (FET) switches made of gallium-arsenide (GaAs) or complementary metal-oxide-semiconductor (CMOS), or are diode switches.

14. A radio-frequency front-end circuit comprising:
   the radio-frequency filter according to claim 1; and
   a controller configured to control a state of each of the first and second switches.

15. A communication apparatus comprising:
   a radio-frequency (RF) signal processing circuit configured to process a radio-frequency signal to be transmitted by an antenna element and a radio-frequency signal received by the antenna element; and
   the radio-frequency front-end circuit according to claim 14 configured to transfer the radio-frequency signals between the antenna element and the RF signal processing circuit.

* * * * *

UNITED STATES PATENT AND TRADEMARK OFFICE
CERTIFICATE OF CORRECTION

PATENT NO. : 11,012,050 B2  
APPLICATION NO. : 16/515454  
DATED : May 18, 2021  
INVENTOR(S) : Koji Nosaka Page 1 of 1

It is certified that error appears in the above-identified patent and that said Letters Patent is hereby corrected as shown below:

In the Specification

Column 17, Line 17, "b= $L_1C_1 - L_tC_0 - L_tC_1$" should read -- b= $-L_1C_1 - L_tC_0 - L_tC_1$ --.

Column 36, Line 10, "Band (or Band 12," should read -- Band 14 (or Band 12, --.

Column 37, Line 50, "film is 3.5x or" should read -- film is 3.5 λ or --.

Column 37, Line 51, "where X denotes the" should read -- where λ denotes the --.

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*